United States Patent
Grannen et al.

(10) Patent No.: US 10,340,885 B2
(45) Date of Patent: Jul. 2, 2019

(54) BULK ACOUSTIC WAVE DEVICES WITH TEMPERATURE-COMPENSATING NIOBIUM ALLOY ELECTRODES

(71) Applicant: Avago Technologies General IP (Singapore) Pte. Ltd., Singapore (SG)

(72) Inventors: Kevin J. Grannen, Thornton, CO (US); Phil Nikkel, Loveland, CO (US); Tangshiun Yeh, Fort Collins, CO (US); Chris Feng, Fort Collins, CO (US); Tina L. Lamers, Fort Collins, CO (US); John Choy, Westminster, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 1183 days.

(21) Appl. No.: 14/273,506

(22) Filed: May 8, 2014

(65) Prior Publication Data

US 2015/0326200 A1 Nov. 12, 2015

(51) Int. Cl.
*H03H 9/17* (2006.01)
*H03H 9/02* (2006.01)
*H03H 9/13* (2006.01)

(52) U.S. Cl.
CPC ........ *H03H 9/175* (2013.01); *H03H 9/02102* (2013.01); *H03H 9/13* (2013.01); *H03H 9/171* (2013.01); *H03H 9/173* (2013.01)

(58) Field of Classification Search
CPC ........... H03H 3/04; H03H 9/09; H01L 41/053
USPC ........................................ 310/346, 347, 348
See application file for complete search history.

(56) References Cited

U.S. PATENT DOCUMENTS

| | | | |
|---|---|---|---|
| 3,200,354 | A | 8/1965 | White |
| 4,419,202 | A | 12/1983 | Gibson |
| 4,490,641 | A | 12/1984 | Takeuchi et al. |
| 5,587,620 | A | 12/1996 | Ruby et al. |

(Continued)

FOREIGN PATENT DOCUMENTS

| | | |
|---|---|---|
| JP | 8-319158 | 12/1996 |
| JP | 2009201101 | 9/2009 |
| WO | 2011004601 | 1/2011 |

OTHER PUBLICATIONS

Office Action dated Jun. 1, 2016 in Chinese Application No. 201310471508.5 (Unofficial/non-certified translation provided by foreign agent included).

(Continued)

*Primary Examiner* — Bryan P Gordon

(57) ABSTRACT

A bulk acoustic wave (BAW) resonator having a first electrode, a second electrode, and a piezoelectric layer between the first electrode and the second electrode. The first electrode is of a first electrode material. The second electrode is of a second electrode material. The piezoelectric layer is of a piezoelectric material doped with at least one rare earth element. The BAW resonator has a resonant frequency dependent at least in part on respective thicknesses and materials of the first electrode, the second electrode and the piezoelectric layer. The resonant frequency has a temperature coefficient. At least one of the first electrode and the second electrode includes a niobium alloy electrode material that, relative to molybdenum as the electrode material, reduces the temperature coefficient of the resonant frequency of the BAW resonator.

28 Claims, 7 Drawing Sheets

(56) References Cited

U.S. PATENT DOCUMENTS

| | | | |
|---|---|---|---|
| 5,616,208 A | 4/1997 | Lee | |
| 5,873,153 A | 2/1999 | Ruby et al. | |
| 5,910,756 A | 6/1999 | Ella | |
| 6,060,818 A | 5/2000 | Ruby et al. | |
| 6,074,971 A | 6/2000 | Chiu et al. | |
| 6,099,700 A | 8/2000 | Lee | |
| 6,107,721 A | 8/2000 | Lakin | |
| 6,129,886 A | 10/2000 | Tachimoto et al. | |
| 6,262,637 B1 | 7/2001 | Bradley et al. | |
| 6,384,697 B1 | 5/2002 | Ruby | |
| 6,441,539 B1 | 8/2002 | Kitamura | |
| 6,507,093 B2 | 1/2003 | Ruby et al. | |
| 6,507,983 B1 | 1/2003 | Ruby et al. | |
| 6,709,557 B1 | 3/2004 | Kailsam et al. | |
| 6,709,776 B2 | 3/2004 | Noguchi et al. | |
| 6,811,719 B2 | 11/2004 | Uchino et al. | |
| 6,828,713 B2 | 12/2004 | Bradley et al. | |
| 6,842,088 B2 | 1/2005 | Yamada | |
| 6,927,651 B2 | 8/2005 | Larson, III et al. | |
| 6,936,837 B2 | 8/2005 | Yamada et al. | |
| 6,936,867 B2 | 8/2005 | Yamada et al. | |
| 6,987,433 B2 | 1/2006 | Larson, III et al. | |
| 7,091,649 B2 | 8/2006 | Larson, III et al. | |
| 7,098,573 B2 | 8/2006 | Stommer | |
| 7,180,224 B2 | 2/2007 | Bouche et al. | |
| 7,275,292 B2 | 10/2007 | Ruby et al. | |
| 7,280,007 B2 | 10/2007 | Feng et al. | |
| 7,345,410 B2 | 3/2008 | Grannen et al. | |
| 7,358,831 B2 | 4/2008 | Larson, III et al. | |
| 7,367,095 B2 | 5/2008 | Larson, III et al. | |
| 7,372,346 B2 | 5/2008 | Tilmans et al. | |
| 7,388,454 B2 | 6/2008 | Ruby et al. | |
| 7,420,320 B2 | 9/2008 | Sano et al. | |
| 7,420,876 B2 | 9/2008 | Sugiura | |
| 7,459,990 B2 | 12/2008 | Wunnicke et al. | |
| 7,515,018 B2 | 4/2009 | Handtmann et al. | |
| 7,557,055 B2 | 7/2009 | Zhang et al. | |
| 7,629,865 B2 | 12/2009 | Ruby | |
| 7,642,693 B2 | 1/2010 | Akiyama et al. | |
| 7,714,684 B2 | 5/2010 | Ruby et al. | |
| 7,758,979 B2 | 7/2010 | Akiyama et al. | |
| 7,791,434 B2 | 9/2010 | Fazzio et al. | |
| 7,889,024 B2 | 2/2011 | Bradley et al. | |
| 7,915,803 B2 | 3/2011 | Hamada et al. | |
| 7,977,850 B2 | 7/2011 | Allah et al. | |
| 8,076,828 B2 | 12/2011 | Kawada | |
| 8,188,810 B2 | 5/2012 | Fazzio et al. | |
| 8,248,185 B2 | 8/2012 | Choy et al. | |
| 8,330,235 B2 | 12/2012 | Burak et al. | |
| 8,330,325 B1 | 12/2012 | Burak et al. | |
| 8,575,819 B1 | 11/2013 | Bhugra | |
| 2001/0016551 A1 | 8/2001 | Yushio et al. | |
| 2002/0135270 A1 | 9/2002 | Ballandras | |
| 2002/0165080 A1 | 11/2002 | Sengupta et al. | |
| 2003/0155574 A1 | 8/2003 | Doolittle | |
| 2005/0001698 A1 | 1/2005 | Bouche et al. | |
| 2007/0205850 A1 | 9/2007 | Jamneala et al. | |
| 2007/0227628 A1* | 10/2007 | Koyanagi | C22C 14/00 148/407 |
| 2007/0284971 A1 | 12/2007 | Sano | |
| 2008/0195194 A1* | 8/2008 | Pacetti | A61L 27/06 623/1.16 |
| 2010/0013573 A1 | 1/2010 | Umeda | |
| 2010/0180391 A1 | 7/2010 | Pruett et al. | |
| 2010/0327697 A1* | 12/2010 | Choy | H03H 9/02118 310/335 |
| 2010/0327994 A1 | 12/2010 | Choy et al. | |
| 2011/0006298 A1* | 1/2011 | Aburaya | H01L 29/4908 257/43 |
| 2011/0121689 A1 | 5/2011 | Grannen et al. | |
| 2011/0180391 A1 | 7/2011 | Larson, III et al. | |
| 2011/0204997 A1 | 8/2011 | Elbrecht et al. | |
| 2011/0266917 A1 | 11/2011 | Metzger et al. | |
| 2012/0104900 A1 | 5/2012 | Nishihara et al. | |
| 2012/0146744 A1* | 6/2012 | Nishihara | H03H 3/02 333/189 |
| 2012/0177816 A1* | 7/2012 | Larson, III | C23C 14/022 427/100 |
| 2012/0293278 A1* | 11/2012 | Burak | H03H 9/1007 333/189 |
| 2012/0326807 A1 | 12/2012 | Choy et al. | |
| 2013/0127300 A1 | 5/2013 | Umeda et al. | |
| 2013/0147577 A1* | 6/2013 | Nishihara | H03H 9/706 333/133 |
| 2013/0176086 A1* | 7/2013 | Bradley | H03H 9/1007 333/189 |
| 2014/0125202 A1 | 5/2014 | Choy et al. | |
| 2014/0125203 A1 | 5/2014 | Choy et al. | |

OTHER PUBLICATIONS

Akiyama, et al., "Enhancement of piezoelectric response in scandium aluminum nitride alloy thin films prepared by dual reactive cosputtering", Advanced Materials, vol. 21, 2009, 593-596.

Akiyama, et al., "Preparation of scandium aluminum nitride thin films by using scandium aluminum alloy sputtering target and design of experiments", Journal of the Ceramic Society of Japan, 118, [12], 2010, 1166-1169.

Al-Ahmad, et al., "Piezoelectric-Based Tunable Microstrip Shunt Resonator", Proceedings of Asia-Pacific Microwave Conference, 2006.

Constantin, et al., "Composition-dependent structural properties in ScGaN alloy films: A combined experimental and theoretical study", Journal of Applied Physics, vol. 98, No. 12, American Institute of Physics, USA, Dec. 16, 2005, 1-8.

Dimitiu, et al., "Complex Rare-earth Substituted Lead Titanate Piezoceramics", 2004 IEEE International Ultrasonics, Ferroelectrics, and Frequency Control Joint 50th Anniversary Confierence, 2004, 297-300.

Dubois, et al., "Properties of Aluminum Nitride Thin Films for Piezoelectric Transducers and Microwave Filter Applications", Applied Physics Letters, vol. 74, No. 20, May 17, 1999, 1-3.

Farrer, et al., "Properties of hexagonal ScN versus wurtzite GaN and InN", Physical Review B, vol. 66, No. 20, The American Physical Society, USA, Dec. 16, 2005, 1-4.

Felmetsger, et al., "Reactive Magnetron Sputtering of Piezoelectric Cr-Doped AlN Thin Films", PVD Product Group OEM Group Incorporated. http://www.oemgroupinc.com/dopedAIN.pdf; published in the 2011 International IEEE Ultrasonics Symposium, Oct. 18-21, 2011, Oct. 18, 2011, 835-839.

IEEE Xplore Abstract, "Reactive Magnetron Sputtering of Piezoelectric Cr-Doped AIN Thin Films", Oct. 18, 2011.

Kabulski, et al., "Erbium Alloyed Aluminum Nitride Films for Piezoelectric Applications", Mater. Res. Soc. Symp. Proc. vol. 1129 (c) 2009 Materials Research Society, 2009, 1-5.

Moreira, et al., "Aluminum scandium nitride thin-film bulk acoustic resonators for wide band applications", vol. 86, Issue 1, Jul. 4, 2011, 23-26.

Pagan, "Aluminum Nitride Deposition/Characterization & Pmems/Saw Device Simulation/Fabrication", Lane Department of Computer Science and Electrical Engineering, Morgantown, West Virginia, 2009, 10186.

Pensala, "Thin Film Bulk Acoustic Wave Devices: Performance Optimization and Modeling", VTT Publications 756, http://www.vtt.fi/inf/pdf/publications/2011/P756.pdf; dissertation presented Feb. 25, 2011, copyright VTT 2011, Feb. 25, 2011, 1-108.

Ranjan, et al., "Strained Hexagonal ScN: A Material with Unusual Structural and Optical Properties", Physical Review Letters, vol. 90, No. 25, The American Physical Society, USA,, Jun. 23, 2007, 1-4.

Suzuki, et al., "Influence of shadowing effect on shear mode acoustic properties in the c-axis tilted AlN films", IEEE International Ultrasonics Symposium, 2010, 1478-1481.

Tasnadi, et al., "Origin of the Anomalous Piezoelectric Response in Wurtzite $Sc_xA/1-xN$ Alloys", Department of Physics, Chemistry and Biology (IFM), Linkoping University. http://arxiv.org/pdf/1003.3353.pdf, Mar. 18, 2010, 1-10.

(56) References Cited

OTHER PUBLICATIONS

Zhou, et al., "Energetics and electronic structures of AlN nanotubes/wires and their potential application as ammonia sensors", Nanotechnology 18 (2007) 424023, 2007, 1-8.
Co-pending U.S. Appl. No. 14/161,564, filed Jan. 22, 2014.
Co-pending U.S. Appl. No. 13/662,460, filed Oct. 27, 2012.
Co-pending U.S. Appl. No. 13/906,873, filed May 31, 2013.
Co-pending U.S. Appl. No. 14/069,312, filed Oct. 31, 2013.
Hubbell, et al., "Elastic constants of niobium-molybdenum alloys in the temperature range—190 to +100 degrees C", J. Appl. Phys. vol. 43 No. 8 p. 3306 Aug. 1972.
Frey, et al., "Elastic constants of niobium-zirconium, hafnium, and tungsten alloys", J. Appl. Phys. vol. 49 No. 8 Aug. 1978 p. 4406.
"Ferroelectricity", Wikipedia article [retrieved on Sep. 22, 2016]. Retrieved from the Internet: <https://en.wikipedia.org/wiki/Ferroelectricity>.
Salim, Zaahir, "Piezoelectric and ferroelectric materials", published Mar. 6, 2013 [retrieved on Sep. 22, 2016]. Retrieved from the Internet: <http://www.slideshare.net/researcher1234/ferroelectric-and-piezoelectric-materials>.
"NPL of List of Rare Earth Elements, Rare Element Resources", Office Action dated Jun. 23, 2016 in U.S. Appl. No. 14/161,564 (No date provided provided by Examiner; no date evident on document.).
Yanagitani et al., "Giant shear mode electromechanical coupling coefficient k12 in c-axis tilted ScAlN films," IEEE Ultrasonics Symposium (IUS), 2010.
Chen, "Fabrication and Characterization of AlN Thin Film Bulk Acoustic Wave Resonator", Dissertation, University of Pittsburgh School of Engineering, 2006.
Martin, et al., "Re-growth of C-Axis Oriented AlN Thin Films", IEEE Ultrasonics Symposium, 2006, 169-172.
Martin, et al., "Shear Mode Coupling and Tilted Gram Growth of AlN Thin Films in BAW Resonators", IEEE Transactions on Ultrasonics, Ferroelectrics, and Frequency Control, vol. 53, No. 7, Jul. 2006, 1339-1343.
Hagimura et al., "Impurity Doping Effect on Electric Field Induced Strains in (Pb, Ba) (Zr, Ti)O3", 1990 IEEE 7th International Symposium on Applications in Ferroelectrics, Jun. 6-8, 1990, pp. 185-188 and a 1 page IEEE Xplore Abstract.

\* cited by examiner

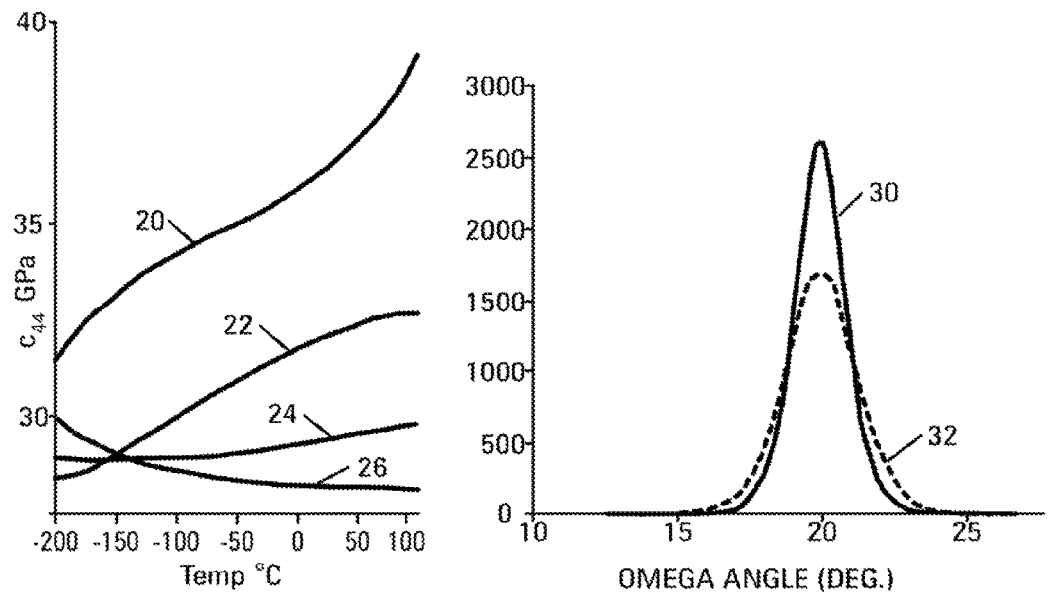
FIG.5
FIG.6
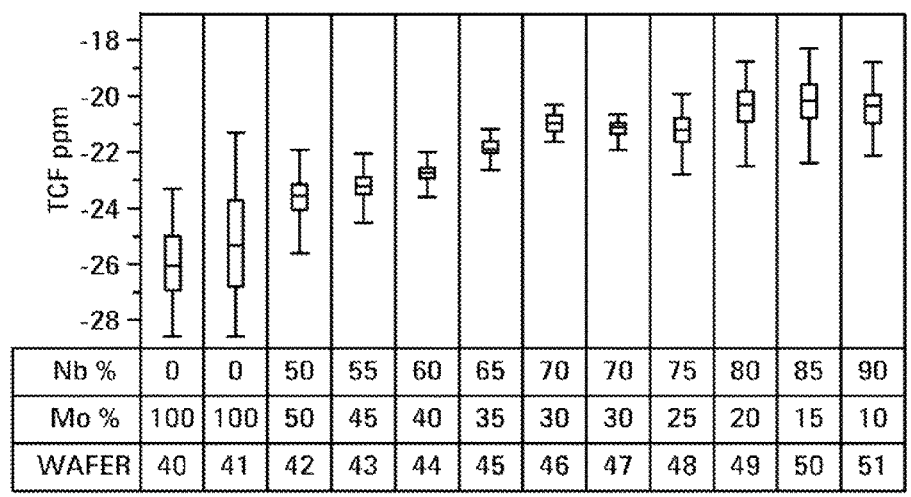
FIG.7

BULK ACOUSTIC WAVE DEVICES WITH TEMPERATURE-COMPENSATING NIOBIUM ALLOY ELECTRODES

BACKGROUND

Electro-acoustic transducers, such as surface acoustic wave (SAW) resonators and bulk acoustic wave (BAW) resonators, are used in a wide variety of electronic applications, such as cellular telephones, smart phones, electronic gaming devices, laptop computers and other portable communications devices. BAW resonators include a resonator stack mechanically isolated from a substrate by an acoustic reflector. For example, BAW resonators include film bulk acoustic resonators (FBARs), which have a resonator stack isolated from a substrate by a cavity that which functions as the acoustic reflector, and solidly mounted resonators (SMRs), which include a resonator stack isolated from a substrate by a stack of alternating layers of low acoustic impedance material and high acoustic impedance material (e.g., an acoustic Bragg reflector). BAW resonators are used to construct electrical filters and voltage transformers, for example.

Typically, a BAW resonator has a layer of piezoelectric material between two electrodes. Examples of the piezoelectric material include aluminum nitride (AlN), zinc oxide (ZnO), and lead zirconate titanate (PZT). Aluminum nitride is advantageous since aluminum nitride maintains its piezoelectric properties at a high temperature (e.g., above 400° C.).

A BAW resonator has a series electrical resonance and a parallel electrical resonance. The series resonance is at a series resonant frequency Fs at which a dipole vibration in the resonator stack is in phase with the electric field applied to the piezoelectric layer. On a Smith Chart, the series resonance frequency Fs is the frequency at which the Q circle crosses the horizontal axis. The series resonance frequency is governed by, inter alia, the total thickness of the resonant stack. Decreasing the total thickness of the resonant stack increases the series resonance frequency. Moreover, the thickness of the piezoelectric layer determines the bandwidth of the BAW resonator. Specifically, a certain electromechanical coupling coefficient $k_t^2$ is needed for the series resonance of the BAW resonator to have a specified bandwidth. The $k_t^2$ of a BAW resonator is influenced by several factors, such as the respective dimensions (e.g., thickness) of the piezoelectric layer and of the electrodes, and the composition and structural properties of the piezoelectric material and the electrode material(s). Typically, for a particular piezoelectric material, increasing the thickness of the piezoelectric layer increases $k_t^2$. Once the bandwidth is specified, $k_t^2$ is set, and the thickness of the piezoelectric layer of the BAW resonator is fixed.

Recently, piezoelectric materials having a different relationship between $k_t^2$ and the thickness of the piezoelectric layer have been disclosed. These materials enable a defined $k_t^2$ to be obtained using a thinner piezoelectric layer and thicker electrodes. Additionally, electrode structures that increase the Q-factors of the resonances (and the Q-factor of the parallel resonance in particular) have been disclosed. BAW resonators incorporating these developments have better performance than conventional BAW resonators. However, in some cases, properties of the improved BAW resonators are more temperature dependent than those of conventional BAW resonators What is needed, therefore, is an improved BAW resonator having properties that are less temperature dependent.

BRIEF DESCRIPTION OF THE DRAWINGS

FIG. 5 is a graph showing the temperature variation of the $c_{44}$ elastic constant of various niobium-molybdenum alloys.

FIG. 6 is a graph showing the rocking curve of an example of a niobium-molybdenum alloy deposited on an aluminum nitride piezoelectric layer by dual-target sputtering.

FIG. 7 is a chart showing the range of the measured TCFs of FBARs having various second electrode materials.

DETAILED DESCRIPTION

Figure 1A:
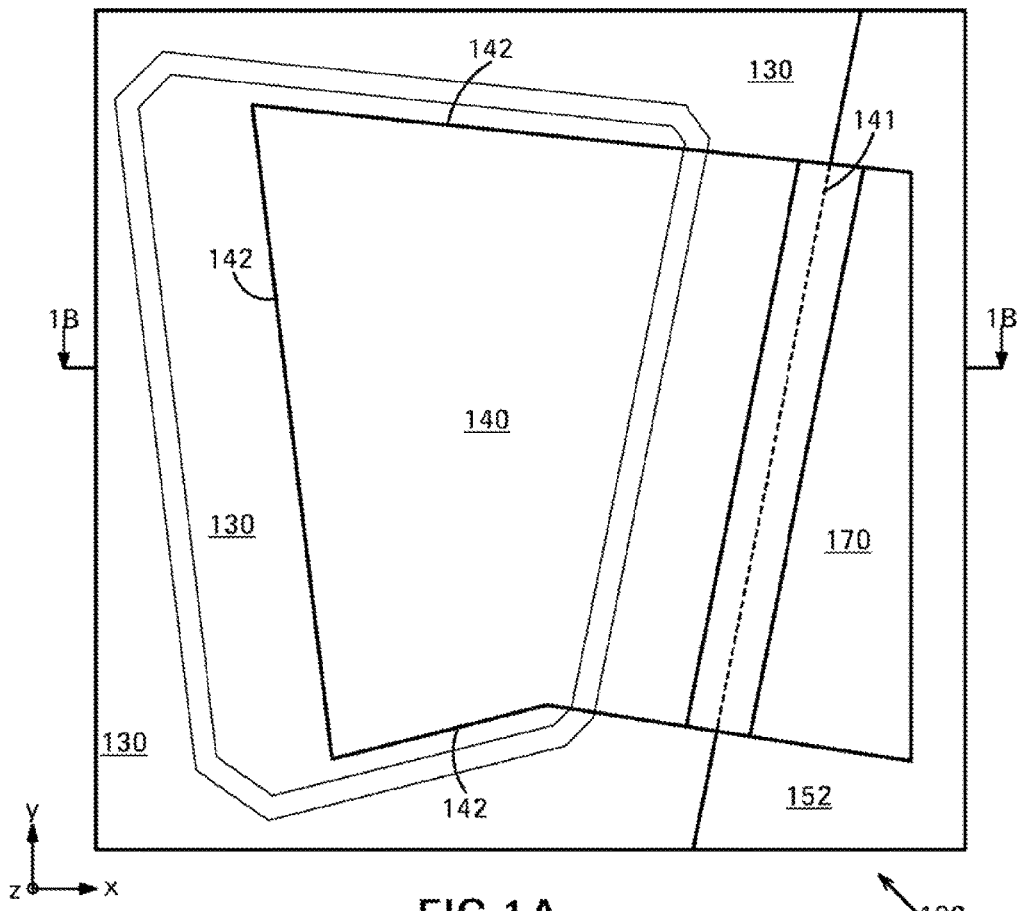
FIGS. 1A and 1B are a plan view and a cross-sectional view, respectively, showing an example of a film bulk acoustic resonator (FBAR) in accordance with the disclosure.

Disclosed herein is a bulk acoustic wave (BAW) resonator having a first electrode, a second electrode, and a piezoelectric layer between the first electrode and the second electrode. The first electrode is of a first electrode material, and has a first electrode thickness. The second electrode is of a second electrode material, and has a second electrode thickness. The piezoelectric layer is of a piezoelectric material doped with at least one rare earth element, and has a piezoelectric layer thickness. The BAW resonator has a resonant frequency dependent at least in part on the first electrode thickness, the first electrode material, the second electrode thickness, the second electrode material, the piezoelectric layer thickness, and the piezoelectric material. The resonant frequency has a temperature coefficient. At least one of the first electrode material and the second electrode material is a niobium alloy that, relative to molybdenum as the respective at least one of the first electrode material and the second electrode material, reduces the temperature coefficient of the resonant frequency of the BAW resonator.

Aspects of this disclosure are relevant to components of BAW resonator devices and filters, their materials and their methods of fabrication. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,629, 865, 7,714,684 to Ruby et al.; U.S. Pat. Nos. 7,791,434 and 8,188,810, to Fazzio, et al.; U.S. Pat. No. 7,280,007 to Feng et al.; U.S. Pat. No. 8,248,185 to Choy, et al.; U.S. Pat. No. 7,345,410 to Grannen, et al.; U.S. Pat. No. 6,828,713 to Bradley, et al.; U.S. Patent Application Publication No. 20120326807 to Choy, et al.; U.S. Patent Application Publication No. 20100327994 to Choy, et al.; U.S. Patent Application Publications Nos. 20110180391 and 20120177816 to Larson III, et al.; U.S. Patent Application Publication No. 20070205850 to Jamneala et al.; U.S. patent application Ser. No. 14/161,564 entitled: "Method of Fabricating Rare-Earth Element Doped Piezoelectric Material with Various Amounts of Dopants and a Selected C-Axis Orientation," filed on Jan. 22, 2014 to John L. Larson III; U.S. patent application Ser. No. 13/662,460 entitled "Bulk Acoustic Wave Resonator having Piezoelectric Layer with Multiple Dopants," filed on Oct. 27, 2012 to Choy, et al.; and U.S. patent application Ser. No. 13/906,873 entitled "Bulk Acoustic Wave Resonator having Piezoelectric Layer with Varying Amounts of Dopants" to John Choy, et al. and filed on May 31, 2013.

The embodiments relate described herein generally to bulk acoustic wave (BAW) resonators. Generally, a BAW resonator includes a first electrode, a second electrode, and a piezoelectric layer between the first electrode and the second electrode. The piezoelectric layer includes a piezoelectric material doped with at least one rare earth element. By incorporating specific atomic percentages of at least one rare earth element into the piezoelectric material, the piezoelectric properties of the piezoelectric material, including a piezoelectric coefficient $d_{33}$ and an electromechanical coupling coefficient $k_t^2$, are improved as compared to an undoped version of the piezoelectric material. In the BAW resonators disclosed herein, at least one of the first electrode and the second electrode is composed of a respective electrode material that is a niobium alloy. A niobium alloy having a specific percentage of niobium reduces the temperature coefficient of the resonant frequencies of the BAW resonator compared to that of a similar conventional BAW resonator in which the electrode material of the respective at least one of the first electrode and the second electrode is molybdenum or tungsten.

As will be described more fully below, because of the improvement in $k_t^2$ provided by doping the piezoelectric material of the piezoelectric layer with at least one rare earth element, for given resonant frequencies of a BAW resonator, and a given bandwidth of a bandpass filter constructed using multiple instances of the BAW resonator, the BAW resonator may be fabricated with a thinner piezoelectric layer than is possible with undoped piezoelectric material. As a result, the thickness constraints on the electrodes can be relaxed, and the thickness of the electrodes of the BAW resonator can be increased relative to the electrodes of a conventional BAW resonator having a thicker piezoelectric layer of conventional undoped piezoelectric material. Because the electrodes of the BAW resonators disclosed herein are comparatively thicker, the BAW resonators have a lower a lower series resistance $R_s$ and the quality factor $Q_s$ of the series resonance of the BAW resonance is improved. Moreover, the thicker electrodes result in a BAW resonator having a comparatively high parallel resistance $R_p$ and a parallel resonance having a high quality factor $Q_p$. Finally, fabricating one or both of the thicker electrodes using a suitable niobium alloy reduces the temperature coefficient of the resonant frequencies of the BAW resonator.

Figure 1B:
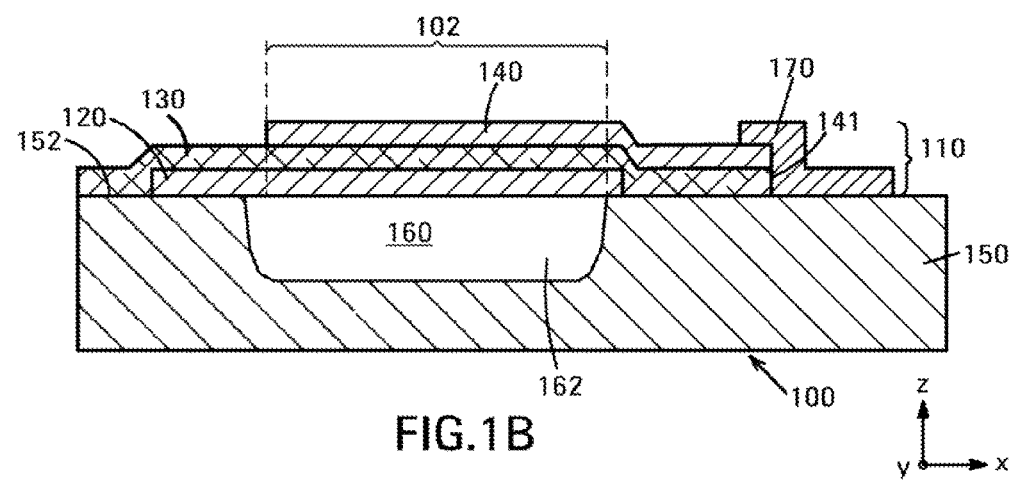

FIG. 1A is a plan view showing an example 100 of a film bulk acoustic resonator (FBAR) in accordance with the disclosure. FIG. 1B is a cross-sectional view showing FBAR 100 taken along section line 1B-1B in FIG. 1A. FBAR 100 includes a resonator stack 110 formed of multiple layers supported by a substrate 150. Resonator stack 110 includes a first electrode 120 adjacent substrate 150, a second electrode 140 remote from substrate 150, and a piezoelectric layer 130 between first electrode 120 and second electrode 140. In the example shown, second electrode 140 has four sides. In other examples, second electrode 140 has fewer or more than four sides.

FBAR 100 additionally includes an acoustic reflector 160 that acoustically isolates resonator stack 110 from substrate 150. In the example shown in FIG. 1B, acoustic reflector 160 is embodied as a cavity 162 extending into substrate 150 from the major surface 152 of the substrate. FBAR 100 includes an active region 102, which is a region of the FBAR parallel to major surface 152 where acoustic reflector 160, first electrode 120, piezoelectric layer 130 and second electrode 140 all overlap.

FBAR 100 additionally includes an interconnect 170 electrically connected to one of the sides of second electrode 140. The side of second electrode 140 to which interconnect 170 connects is referred as here in as a connected side 141. The remaining sides of second electrode 140 are referred to herein as non-connected sides 142. Interconnect 170 and another interconnect (not shown) provide connections for applying an electrical signal between first electrode 120 and second electrode 140. The electrical signal applied by first and second electrodes 120, 140 to piezoelectric layer 130 excites acoustic waves in the resonator stack 110 of the FBAR 100. In other examples, second electrode 140 has more or fewer non-connected sides 142 than the number exemplified in FIG. 1A.

Figure 2:
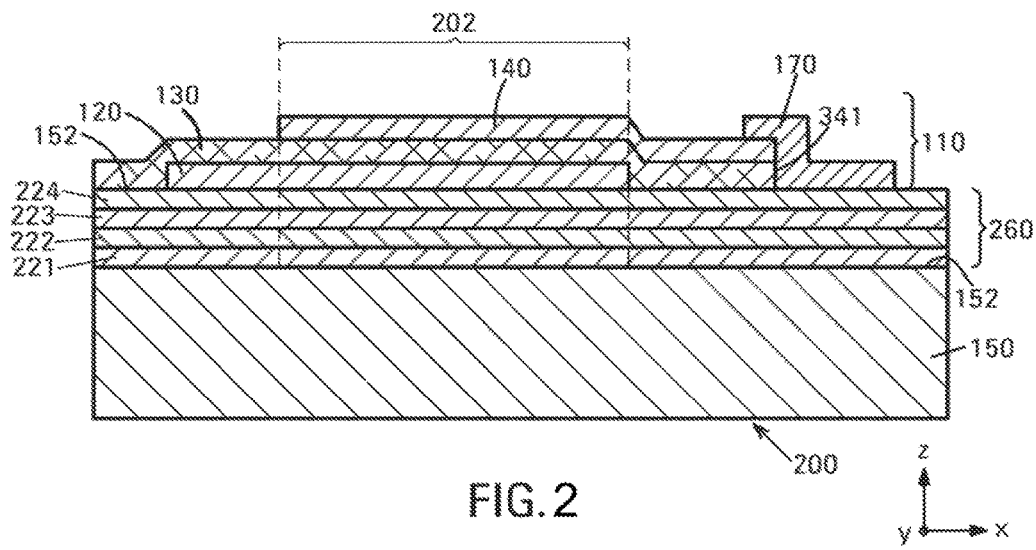
FIG. 2 is a cross-sectional view showing an example of a surface-mount resonator (SMR) in accordance with the disclosure.

FIG. 2 is a cross-sectional view showing an example 200 of a surface-mount resonator (SMR) in accordance with the disclosure. A plan view of SMR 200 is substantially similar to that of FBAR 100 shown in FIG. 1A, and is therefore not shown. Elements of SMR 200 that correspond to elements of FBAR 100 described above with reference to FIGS. 1A and 1B are indicated using the same reference numerals and will not be described again in detail.

SMR 200 includes resonator stack 110 composed of first electrode 120 adjacent substrate 150, second electrode 140 remote from substrate 150, and piezoelectric layer 130 between first electrode 120 and second electrode 140. SMR 200 additionally includes an acoustic reflector 260 between the major surface 152 of substrate 150 and resonator stack 110. Acoustic reflector 260 is composed of alternating layers of high acoustic impedance and low acoustic impedance materials and acoustically isolates resonator stack 110 from substrate 150. SMR 200 includes an active region 202, which is a region of the SMR parallel to major surface 152 where acoustic reflector 260, first electrode 120, piezoelectric layer 130, and second electrode 140 all overlap.

In an example, acoustic reflector 260 is a distributed Bragg reflector (DBR) or another acoustic mirror formed of multiple acoustic impedance layers, indicated by four representative acoustic impedance layers 221, 222, 223, 224 and is located between first electrode 120 and the major surface 152 of substrate 150.

BAW resonators 100, 200 will be described in greater detail below.

Figure 3:
FIG. 3 is a graph showing an example of the variation of Lennard-Jones potential with inter-atomic distance.

Bulk acoustic wave (BAW) resonators, such as FBAR 100 and SMR 200 described above with reference to FIGS. 1A, 1B and 2, are typically specified to operate over a wide temperature range, for example, between −30° C. and 70° C. A fundamental property of matter is that the equilibrium bond length between the constituent atoms of the material changes with temperature. Specifically, the equilibrium bond length between the constituent atoms increases with increasing temperature. FIG. 3 is a graph showing an example of the variation of Lennard-Jones potential with inter-atomic distance. The Lennard-Jones potential is a potential that develops when two atoms are brought in proximity of one another. FIG. 3 provides a graphical illustration of the above-described behavior. The lowest point or "well" in the curve is indicated at 220 and is the point where the energy is minimized and the attractive forces between the atoms are balanced by the repulsive forces between the atoms. The interatomic distance at which the well occurs is defined as the interatomic spacing or bond length $x_0$. Reducing the temperature shifts the equilibrium position to the left, resulting in a decrease in the bond length or inter-atomic spacing. Increasing the temperature shifts the equilibrium position to the right, resulting in an increase in the bond length or inter-atomic spacing.

Figure 4:
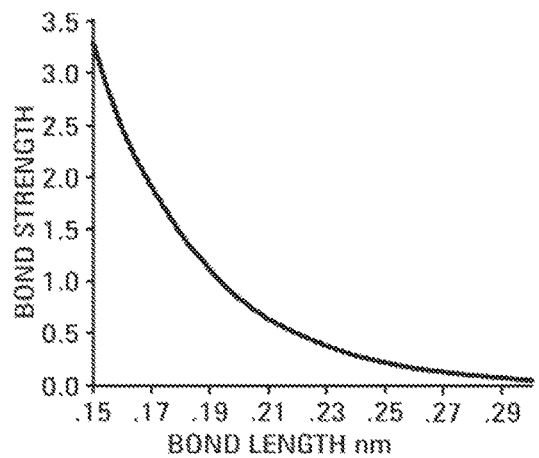
FIG. 4 is a graph showing an example of the dependence of bond strength on bond length.

FIG. 4 is a graph showing an example of the dependence of bond strength on bond length. As bond length increases, bond strength decreases. In a BAW resonator, as temperature increases, bond length increases, and the elastic constants decrease. The decreased elastic constants are the predominant cause of a decrease in the acoustic velocities and a consequent decrease in the resonant angular frequency of the BAW resonator:

$$\omega \approx \frac{1}{2\pi}\frac{v}{2d} \qquad (1)$$

$$\frac{1}{\omega}\frac{d\omega}{dT} = \frac{1}{2}\left(\frac{1}{c}\frac{dc}{dT} + \frac{1}{V}\frac{dV}{dT}\right) - \frac{1}{d}\frac{dd}{dT} \qquad (2)$$

$$\tau_f = \frac{1}{2}(c_\tau + \alpha_v) - \alpha_l \qquad (3)$$

Substituting $3\alpha_1$ for $\alpha_v$ in equation (3) gives:

$$\tau_f = \frac{1}{2}(c_\tau + \alpha_l) \qquad (4)$$

Where: $\omega$ is the angular frequency, v is the acoustic velocity, d is the thickness of the resonating layer, T is temperature, c represents the elastic constants of the resonating layer, V is the volume of the resonating layer, $\tau_f$ is the temperature coefficient of frequency, $c_\tau$ is the change in elastic constants with temperature, $\alpha_v$ is the volume thermal expansion coefficient and $\alpha_1$ is the linear thermal expansion coefficient.

The above equations relate the change in resonant frequency with temperature to the change in material properties with temperature. The resonant angular frequency of a BAW resonator is approximated by the dividing the acoustic velocity by twice the thickness (equation (1)). Differentiating equation (1) with respect to temperature yields equation (2) that relates the change in the resonant angular frequency with temperature to the change in elastic constants, the change in volume and the change in length with temperature. The change in the elastic constants with temperature is an order of magnitude larger than the changes in volume and length due to thermal expansion. Consequently, materials whose elastic constant increases with increasing temperature are most effective for reducing the temperature dependence of the resonant angular frequency of a BAW resonator.

Materials having an elastic constant that increases with increasing temperature are not easily found. Bond lengths typically increase with increasing temperature, resulting in elastic constants that reduce with increasing temperature. However, Hubble et al. (43 J. APPL. PHYS. 3306 (August 1972) and Frey et al. (49 J. APPL. PHYS. 4406 (August 1978)) disclose that niobium and some niobium alloys have some elastic constants, most notably the $c_{44}$ elastic constant, that increase with increasing temperature, or that at least do not decrease with increasing temperature. FIG. 5 is a graph showing the temperature variation of the $c_{44}$ elastic constant of various niobium-molybdenum alloys over a temperature range from −200° C. to 100° C. In FIG. 5, curve 20 is for a 33.9% Mo-66.1% Nb alloy, curve 22 is for a 23.3% Mo-76.7% Nb alloy, curve 24 is for a 16.8% Mo-83.2% Nb alloy, and curve 26 is for 100% Nb. The elastic constants of the niobium alloys shown in curves 20, 22 and 24 exhibit an increase with increasing temperature. The elastic constant of niobium shown in curve 26 exhibits a relatively small decrease with increasing temperature.

A $c_{44}$ elastic constant that increases with increasing temperature is not, in itself, a sufficient indicator of a material with a positive temperature coefficient of frequency (TCF). The longitudinal acoustic velocity along the [110] crystal axis and the [110] direction is given by:

$$v^2 = \frac{\left[\frac{1}{2}(c_{11} + c_{12}) + c_{44}\right]}{\rho} \qquad (5)$$

where v is the acoustic velocity, $c_{11}$, $c_{12}$ and $c_{44}$ are elastic constants and $\rho$ is the density of the material.

Using data for the elastic constants at different temperatures and calculating corresponding acoustic velocities using equation (5), the temperature coefficient of frequency for the different materials can be determined. For a 66% Nb-34% Mo alloy, the calculated temperature coefficient of frequency (TCF) can be as high as +42 ppm/° C. For comparison, the temperature coefficients of frequency of pure molybdenum, tungsten and aluminum nitride are about −38 ppm/° C., −32 ppm/° C., and −22 ppm/° C., respectively. As noted above, several other niobium alloys have positive TCFs, but the positive TCFs of these alloys are typically less than +42 ppm.

Bulk acoustic wave (BAW) resonators were fabricated to gauge the effect of various Nb—Mo alloy electrode materials on the temperature coefficient of frequency of the BAW resonators. Specifically, film bulk acoustic resonators (FBARs) similar in structure to FBAR 100 described above with reference to FIGS. 1A and 1B were fabricated as examples of BAW resonators. In these experiments, only the second electrode 140 of the FBAR was made of the Nb—Mo alloy electrode material being tested. During fabrication of the FBARs, second electrode 140 was deposited on piezoelectric layer 130 from a dual-target sputtering source. By varying the respective sputter power on each of the targets, any electrode material composition of interest, ranging from 100% Nb to 100% Mo could be deposited.

To deposit Nb—Mo alloy electrode material with the positive TCFs described above, the electrode material should be deposited in the above-described [110] orientation. The electrode material of first electrode 120 is deposited with the [110] orientation to define the [110] orientation of the piezoelectric material of piezoelectric layer 130 deposited on first electrode 120. Second electrode 140 is deposited with the [110] orientation to match he orientation of first electrode 120, which gives symmetric acoustic performance. FIG. 6 is a graph showing the rocking curve of an example of a 66% Nb-34% Mo alloy deposited on a [110] oriented aluminum nitride piezoelectric layer by dual-target sputtering. In FIG. 6, curve 30 is the rocking curve of the niobium alloy electrode material deposited on the surface of a freshly-deposited layer of aluminum nitride, and curve 32 is the rocking curve of the niobium alloy electrode material deposited on the surface of a layer of aluminum nitride that was previously deposited and was subsequently cleaned by a surface etch prior to depositing the electrode material. The [110] peaks of pure Nb and pure Mo should be at angles of about 19.15° and 20.25° respectively. An alloy of Nb and Mo should exhibit a peak centered at an angle between the angles for the pure metals, with the exact value depending on the composition of the alloy. In the examples shown, each rocking curve exhibits a peak at an angle between the angles for the pure metals. This demonstrates that the above-described sputter deposition method deposits the Nb—Mo alloy electrode material with the correct [110] orientation.

FBARs having second electrodes with various Nb—Mo alloy electrode materials were fabricated on respective wafers and representative FBARs from each wafer were subject to electrical testing to measure their temperature coefficient of frequency (TCF). The alloy electrode materials ranged from 50% Nb-50% Mo to 90% Nb-10% Mo. The percentages used to describe the various niobium alloys referred to herein are atomic percentages. For example, a 50% Nb-50% Mo alloy contains equal numbers of niobium and molybdenum atoms. Additionally, two wafers of FBARs with conventional electrodes (100% Mo) were fabricated and tested. An RF signal was input to each FBAR and was swept over a frequency range from 1700 MHz to 1800 MHz. The amplitude of the RF signal across the FBAR was measured to determine the frequencies of the series and parallel resonances. The resonant frequencies were measured with the FBARs at 30° C. and were measured again with the FBARs at 70° C. TCFs for each FBAR were calculated from the respective resonant frequencies measured at the two temperatures. FIG. 7 is a chart showing a respective wafer number for each of the wafers, the range of the measured TCFs of the FBARs fabricated from each of the wafers, and the percentages of niobium and molybdenum in the electrode material of the second electrode of the FBARs fabricated on the respective wafers.

The FBARs having conventional 100% Mo second electrodes fabricated on the wafers 40, 41 had the largest negative TCFs at about −26 ppm/° C. The FBARs having niobium alloy second electrodes with equal portions of niobium and molybdenum fabricated on wafer 42 had a smaller TCF at about 24 ppm/° C. and a smaller range of TCFs, than the conventional FBARs. The FBARs fabricated on wafers 43-45 had progressively smaller TCFs with increasing percentage of niobium in the electrode material. The FBARs fabricated on wafers 46 and 47, both of which had an electrode material with 70% Nb-30% Mo, exhibited the smallest spread of TCFs, and had an average TCF substantially smaller than the FBARs with the conventional electrode material. The FBARs fabricated on wafers 48-51 had a progressively larger spread of TCFs with increasing percentage of niobium in the electrode material from 75% to 90%, but the average TCF was about the same as the FBARs with the 70% Nb electrode material fabricated on wafers 46 and 47. Thus, with electrode material compositions ranging from 70% Nb-30% Mo to 90% Nb-10% Mo, the FBARs have a relatively stable TCF ranging between about −20 ppm/° C. and −22 ppm/° C. This is approximately 20% better than the TCF of FBARs having a conventional second electrode. It is anticipated that other types of BAW resonator with niobium alloy second electrodes would have similar TCFs.

The BAW resonators fabricated as described above had piezoelectric layers of conventional (undoped) aluminum nitride, and the thicknesses of piezoelectric layer, the first electrode and the second electrode were conventional. Doping the piezoelectric layer using a rare earth dopant, as described above, allows a BAW resonator with a defined electromechanical coupling coefficient $k_t^2$ to be fabricated with a reduced thickness of piezoelectric layer 130. Doped piezoelectric material typically has a slightly larger TCF than undoped piezoelectric material, but the reduced thickness of the piezoelectric layer reduces the contribution of the TCF of the piezoelectric material to the TCF of the BAW resonator. Additionally, the increased thickness of the electrodes increases the contribution of the positive TCF of the niobium alloy electrode material to the TCF of the BAW resonator and provides the ability to fabricate BAW resonator having a target TCF by a suitable choice of the composition of the niobium alloy electrode material of the second electrode.

Further control over the TCF of the BAW resonators can be exercised by using a niobium alloy as the electrode material of the first electrode in addition to using a niobium alloy as the electrode material of the second electrode. In some examples, the first electrode and the second electrode are fabricated of the same niobium alloy electrode material. In other examples, the first electrode and the second electrode are fabricated using respective niobium alloy electrode materials having different niobium percentages. In an example, a BAW resonator having conventional piezoelectric material and conventional thicknesses, using a 70% Nb-30% Mo alloy as the electrode material of both electrodes improved the TCF of the BAW resonator to about 10 ppm/° C.

Additional control over the TCF of the FBARs can be exercised by varying the percentage of each of the one or more rare earth dopants in the piezoelectric material of piezoelectric layer 130. For an FBAR having a specified $k_t^2$ and resonant frequency, the dopant percentage determines the respective thickness of the each of the piezoelectric layer, the first electrode and the second electrode, hence, the relative contributions of the respective TCF of each of these elements to the TCF of the FBAR.

BAW resonators in accordance with this disclosure will be further described with reference to the examples shown in FIGS. 1A, 1B and 2. Various types of materials, including semiconductor materials compatible with semiconductor processes, such as silicon Si, gallium arsenide GaAs, indium phosphide InP, or the like may be used as the substrate material of substrate 150. Using a semiconductor material as the substrate material allows connections and electronics to be integrated with the BAW resonator, dissipates heat generated by the BAW resonator, reduces size and cost, and provides a more robust device.

In an example, the electrode material of one of first electrode 120 and second electrode 140 is molybdenum Mo or tungsten W, and the electrode material of the other of first electrode 120 and second electrode 140 is a niobium alloy, such as an alloy of niobium Nb and molybdenum Mo, an alloy of niobium and hafnium Hf, or an alloy of niobium and zirconium Zr. In another example, the electrode material of both first electrode 120 and second electrode 140 is a niobium alloy, such as an alloy of niobium Nb and molybdenum Mo, an alloy of niobium and hafnium Hf, or an alloy of niobium and zirconium Zr. Different niobium alloys may be used for the respective electrode material of first electrode 120 and second electrode 140.

In an example, the percentage of hafnium in an alloy of niobium and hafnium suitable for use as the respective electrode material of one or both of first electrode 120 and second electrode 140 ranges from about 5% to about 20%. In an example, the percentage of hafnium was 11%. In an example, the percentage of zirconium in an alloy of niobium and zirconium suitable for use as the respective electrode material of one or both of first electrode 120 and second electrode 140 ranges from about 5% to 10%. Niobium alloys that include hafnium or zirconium in the ranges just described have small negative temperature coefficients of frequency. However, the small negative TCFs of these alloys are substantially smaller in magnitude than the TCF of pure molybdenum, so substituting these materials for molybdenum as the electrode material of one or both of first electrode 120 and second electrode 140 reduces the TCF of the BAW resonator.

As noted above and as described more fully below, for a particular series resonance frequency $F_s$ and electromechanical coupling coefficient $k_t^2$, using piezoelectric material doped with one or more one or more rare earth elements (e.g., aluminum nitride AlN doped with scandium Sc) as the piezoelectric material of piezoelectric layer 130 allows the thickness (dimension in y-direction in the coordinate system depicted in FIG. 1B) of the piezoelectric layer to be reduced and the thickness of first electrode 120 and second electrode 140 to be increased compared to corresponding elements of a conventional BAW resonator.

In an example, an electromechanical coupling coefficient $k_t^2$ approaching 7% at a series resonance frequency $F_s$ of 1600 MHz can be realized with piezoelectric layer 130 having a thickness of approximately 500 nm of doped piezoelectric material. In another example, a maximum electromechanical coupling coefficient $k_t^2$ of 9% can be realized with piezoelectric layer 130 having a thickness of 1000 nm of doped piezoelectric material. By the doping the piezoelectric material of piezoelectric layer 130, for a specified series resonance frequency $F_s$, the thickness of piezoelectric layer 130 can be reduced. This allows the thicknesses of first electrode 120 and second electrode 140 to be significantly increased (e.g., to be increased from a conventional thickness of about 200 nm to a thickness in a range from about 300 nm to about 400 nm or more), while maintaining the specified electromechanical coupling coefficient $k_t^2$ and bandwidth of the resonance. Increasing the thickness of the electrodes not only allows suitable choices of the niobium alloy used as the respective electrode material of one or both electrodes to reduce the TCF of the BAW resonator, but also reduces the resistance of the electrodes, which increases the Q of the resonance.

In an example, the piezoelectric layer 130 of BAW resonator 100 or BAW resonator 200 is a layer of piezoelectric material doped with at least one rare earth element. In an example, the piezoelectric material is aluminum nitride doped with scandium. The doped piezoelectric material has an increased piezoelectric coefficient $d_{33}$ and an increased electromechanical coupling coefficient $k_t^2$ as a result of the incorporation of the one or more rare-earth elements into the crystal lattice of the piezoelectric material. Doping the piezoelectric material with a specific atomic percentages of the one or more rare-earth elements improves the piezoelectric properties of the piezoelectric material, including piezoelectric coefficient $d_{33}$ and electromechanical coupling coefficient $k_t^2$, compared to entirely stoichiometric (undoped) piezoelectric material. Moreover, for a specified bandwidth, electromechanical coupling coefficient and series resonance frequency, the thickness of the piezoelectric layer 130 of BAW resonator 100 is less than that of the undoped piezoelectric layer of an otherwise similar conventional BAW resonator.

The piezoelectric material of piezoelectric layer 130 is doped with a particular atomic percentage of one or more rare-earth elements to provide a BAW resonator with a specified bandwidth and electromechanical coupling coefficient for a particular series resonance frequency $F_s$. As noted above, in certain embodiments, the doped piezoelectric material of the piezoelectric layer 130 is doped aluminum nitride. In this, a defined percentage of the Al atoms in the AlN crystal lattice are replaced with atoms of one or more rare-earth elements, each referred to herein as a doping element. Because the doping elements replace only Al atoms in the crystal lattice of the piezoelectric material, the percentage of the atoms of the piezoelectric material that are nitrogen atoms remains substantially the same regardless of the percentage of the aluminum atoms replaced with atoms of the one or more doping elements. The atomic percentage of a doping element in an aluminum nitride piezoelectric material is the percentage of the total number of atoms (excluding nitrogen atoms) of the piezoelectric material that are atoms of the doping element.

In an example, AlN piezoelectric material is doped with scandium Sc to create AlScN piezoelectric material with a defined atomic percentage of Sc. The Sc atom has an atomic radius that is larger than the atomic radius of the Al atom, resulting in a Sc—N bond length (0.225 nm) that is greater than the Al—N bond length (0.190 nm). The difference in bond lengths causes stress in the AlScN piezoelectric material.

In an example, the atomic percentage of scandium in doped aluminum nitride piezoelectric material ranges from approximately 0.5% to approximately 10.0%. More generally, the atomic percentage of scandium in doped aluminum nitride piezoelectric material ranges from approximately 0.5% to approximately 44%. In another example, the atomic percentage of scandium in doped aluminum nitride piezoelectric material ranges from approximately 2.5% to approximately 5.0%. So, for example, as described more fully below, if an aluminum alloy target used in a single-target sputtering process to fabricate piezoelectric layer 130 contains approximately 5% Sc and 95% Al, then the atomic percentage of Al in the piezoelectric material of piezoelectric layer 130 deposited using this target will be approximately 95%, and the atomic percentage of Sc in the piezoelectric material deposited using this target will be approximately 5%. The atomic constitution of the piezoelectric material may then be represented as $Al_{0.95}Sc_{0.05}N$.

While examples of scandium-doped aluminum nitride are described above, other rare-earth elements can be used to dope the piezoelectric material of piezoelectric layer 130 in a way that achieves a specified bandwidth, a specified electromechanical coupling coefficient $k_t^2$, and a specified series resonance frequency $F_s$, or in a way that allows various combinations of electrode thicknesses and niobium alloy electrode materials, or the areas combinations of electrode thicknesses, niobium alloy electrode material and conventional electrode material to attain a specified temperature coefficient of frequency. Specifically, the other rare-earth elements include yttrium Y, lanthanum La, cerium Ce, praseodymium Pr, neodymium Nd, promethium Pm, samarium Sm, europium Eu, gadolinium Gd, terbium Tb, dysprosium Dy, holmium Ho, erbium Er, thulium Tm, ytterbium Yb and lutetium Lu.

Additionally, the piezoelectric material of piezoelectric layer 130 can be doped with more than one rare earth element, as described in U.S. patent application Ser. No. 14/069,312, assigned to the assignee of this disclosure. In an example taken from the above-mentioned patent application, doping the aluminum nitride piezoelectric material of an exemplary BAW resonator with an atomic percentage of 0.77% scandium increased the electro-mechanical coupling coefficient $k_t^2$ of the resonator by 0.25%, doping the piezoelectric material of the resonator with an atomic percentage of 0.27% erbium increased the $k_t^2$ of the resonator by 0.2%, but doping the piezoelectric material with 0.63% scandium and 0.34% erbium increased the $k_t^2$ of the resonator by 0.47%.

Referring to FIG. 1A, acoustic reflector 160 acoustically isolates the resonator stack 110 of BAW resonator 100 from substrate 150. In BAW resonator 100, acoustic reflector 160 is embodied as cavity 162 etched into substrate 150 from the major surface 152 thereof at the location of the acoustic reflector. Resonator stack 110 is fabricated over cavity 162 as follows. After cavity 162 has been etched in substrate 150, sacrificial material (not shown), such as phosphosilicate glass (PSG) is deposited on the major surface 152 with a depth sufficient to fill cavity 162. A planarizing process is performed to expose the major surface 152 of the substrate so that the surface of the sacrificial layer is co-planar with major surface 152. A layer of the electrode material of first electrode 120 is deposited on the major surface 152 of substrate 150 and on the surface of the sacrificial material, and is patterned to define first electrode 120 covering part of major surface 152 and covering part of the surface of the sacrificial material. Piezoelectric material is deposited on first electrode 120 and the exposed portions of major surface 152 and the surface of the sacrificial material. The piezoelectric material is then patterned to define piezoelectric layer 130. A layer of niobium alloy electrode material is deposited on piezoelectric layer 130 and the exposed portions of first electrode 120 and major surface 152, and is patterned to define second electrode 140. A selective etch process is then performed to remove the sacrificial material from cavity 162. Completion of the etch process leaves resonator stack 110 suspended over cavity 162. BAW resonator 100 additionally includes an active region 102, which is a region of the BAW resonator parallel to major surface 152 where acoustic reflector 160, first electrode 120, piezoelectric layer 130 and second electrode 140 all overlap.

Referring to FIG. 2, acoustic reflector 260 acoustically isolates the resonator stack 110 of BAW resonator 200 from substrate 150. In BAW resonator 200, acoustic reflector 260 is embodied as a stack of acoustic impedance layers 221-224, which are layers of materials having different acoustic impedances. Each acoustic impedance layer has a respective thickness t z (n+1)*λ/4, where n is an integer ≥0, and λ is the wavelength in the material of the layer of an acoustic wave at the frequency $F_s$ of the series resonance of the BAW resonator. In an example, acoustic impedance layers 221-224 are alternating layers of lower acoustic impedance material and higher acoustic impedance material, such that acoustic impedance layer 221 is a layer of a lower acoustic impedance material, acoustic impedance layer 222 is a layer of a higher acoustic impedance material, acoustic impedance layer 223 is a layer of a lower acoustic impedance material, and acoustic impedance layer 224 is a layer of a higher acoustic impedance material. Typically, acoustic impedance layers 221 and 223 are layers of the same lower acoustic impedance material, and acoustic impedance layers 222 and 224 are layers of the same higher acoustic impedance material. The differing acoustic impedances can be obtained, for instance, by using a relatively soft material for the lower acoustic impedance material of acoustic impedance layers 221 and 223 and using a relatively hard material for the higher acoustic impedance material of acoustic impedance layers 222 and 224. A higher acoustic impedance material is greater in acoustic impedance than a lower acoustic impedance material.

The acoustic isolation provided by acoustic reflector 260 depends on the number of acoustic impedance layers 221-224. The number of acoustic impedance layers is typically determined by a tradeoff between the acoustic reflectivity of the acoustic reflector (e.g., the more layers, the greater the reflectivity) and cost and processing issues (e.g., the fewer layers, the easier and less expensive the acoustic reflector is to fabricate). Thus, the number of acoustic impedance layers may be greater than or less than the number exemplified in FIG. 2. The acoustic isolation provided by acoustic reflector 260 additionally depends on the acoustic impedance contrast between the higher acoustic impedance material and the lower acoustic impedance material of acoustic impedance layers 221-224. A greater acoustic impedance contrast provides greater acoustic isolation. Acoustic impedance layers 221-224 are typically alternating layers of dielectric material and metal, or alternating layers of dielectric materials having contrasting acoustic impedances. In a dielectric and metal example, the lower acoustic impedance material is a dielectric such as silicon oxide $SiO_x$, and the higher acoustic impedance material is a metal such as tungsten W or molybdenum Mo. In an all-dielectric example, the lower acoustic impedance material is carbon-doped silicon oxide (CDO), and the higher acoustic impedance material is silicon nitride ($SiN_x$). A benefit of pairing layers of carbon-doped silicon oxide and silicon nitride is that acoustic reflector 260 can be formed in a single machine by depositing CDO onto the major surface of a silicon wafer in a first chamber, for example, moving the wafer to a second chamber, depositing silicon nitride on the wafer in the second chamber, moving the wafer back into the first chamber, and so on. Other materials from which effective embodiments of acoustic reflector 260 can be made are known and may be used. Acoustic reflector 260 is typically less expensive (e.g., by about 10 percent) to fabricate than acoustic reflector 160 described above with reference to FIG. 1B. Acoustic reflector 260 may be substituted for acoustic reflector 160 in the BAW resonator examples to be described below with reference to FIGS. 8A, 8B, 10A, 10B.

Acoustic reflector 260 is fabricated by depositing the acoustic impedance layers of alternating lower acoustic impedance material and higher acoustic impedance material with the above-described thicknesses on the major surface 152 of substrate 150. Various fabrication processes suitable for depositing the acoustic impedance layers are known and may be used. One example of a suitable fabrication process is described by Larson, III et al. in U.S. Pat. No. 7,358,831. Other ways of depositing acoustic impedance layers of alternating higher acoustic impedance material and lower acoustic impedance material are known and may be used.

Once acoustic reflector 260 has been formed, a layer of the electrode material of first electrode 120 is deposited on acoustic impedance layer 224, and is patterned to define first electrode 120 atop acoustic reflector 260. Piezoelectric material is deposited on first electrode and the exposed portions of acoustic impedance layer 224 and is patterned to define piezoelectric layer 130. The piezoelectric material is doped with at least one rare earth element, as described above. A layer of niobium alloy electrode material is deposited on piezoelectric layer 130 and the exposed portions of first electrode 120 and acoustic impedance layer 224, and is patterned to define second electrode 140, and to complete the fabrication of the resonator stack 110 of BAW resonator 200. As in BAW resonator 100, the active region 202 of BAW resonator 200 is a region of the BAW resonator parallel to major surface 152 where acoustic reflector 260, first electrode 120, piezoelectric layer 130 and second electrode 140 all overlap.

Patterning, as the term is used herein, typically involves depositing a layer of mask material on a surface of the layer to be patterned, applying a layer of photoresist to the mask layer, exposing the photoresist to a pattern of light defined by a photomask, removing portions of the photoresist that were exposed, or that were not exposed, to the light to form windows in the photoresist, etching the mask layer exposed by the windows in the photoresist to define windows in the mask layer, etching the underlying material exposed by the windows in the mask layer, and removing the mask layer. Sometimes, the photoresist is deposited directly on the underlying material and the underlying material exposed by the windows in the photoresist is etched. Processes for performing the patterning operations described above are known in the art and will not be described here.

Processes for depositing the doped piezoelectric material of piezoelectric layer 130 and single-element electrode materials, e.g., of first electrode 120, typically by sputtering, are known in the art will not be described here. Niobium alloy electrode material, e.g., the electrode material of second electrode 140, is described above as being deposited using a dual-target sputter deposition process with the sputter power applied to each target defining the percentage of the respective constituent element in the niobium alloy electrode material. In another example, niobium alloy electrode material is sputter deposited using a single target composed of a target material that is a niobium alloy with the same constituent elements as the electrode material. The ratio between the constituent elements of the target material differs from that in the electrode material to correct for differential scattering of the constituent elements by the gas or gases used in the sputtering process.

An alternating electrical signal applied between the first electrode 120 and the second electrode 140 of the above-described BAW resonators 100, 200 principally excites thickness-extensional (TE) modes in resonator stack 110. TE modes are longitudinal acoustic waves having propagation (k) vectors in the direction of propagation. The TE modes propagate through the resonator stack in the z-direction shown in FIGS. 1B and 2. In addition to the desired TE modes, lateral modes, known as Rayleigh-Lamb modes, additionally propagate in the resonator stack. The Rayleigh-Lamb modes are mechanical waves having k-vectors in directions orthogonal to the direction of TE modes, i.e., in directions parallel to the x-y plane. The Rayleigh-Lamb modes travel in the resonator stack in directions parallel to the major surface 152 of substrate 150. Among other adverse effects, Rayleigh-Lamb modes degrade the improvements in the respective quality factors Q of the resonances of the BAW resonator offered by the materials improvements described above. In particular, the energy of the Rayleigh-Lamb modes is lost at the lateral boundaries of the resonator stack. The loss of energy to spurious modes is a loss in energy from the desired longitudinal modes.

Figure 8A:
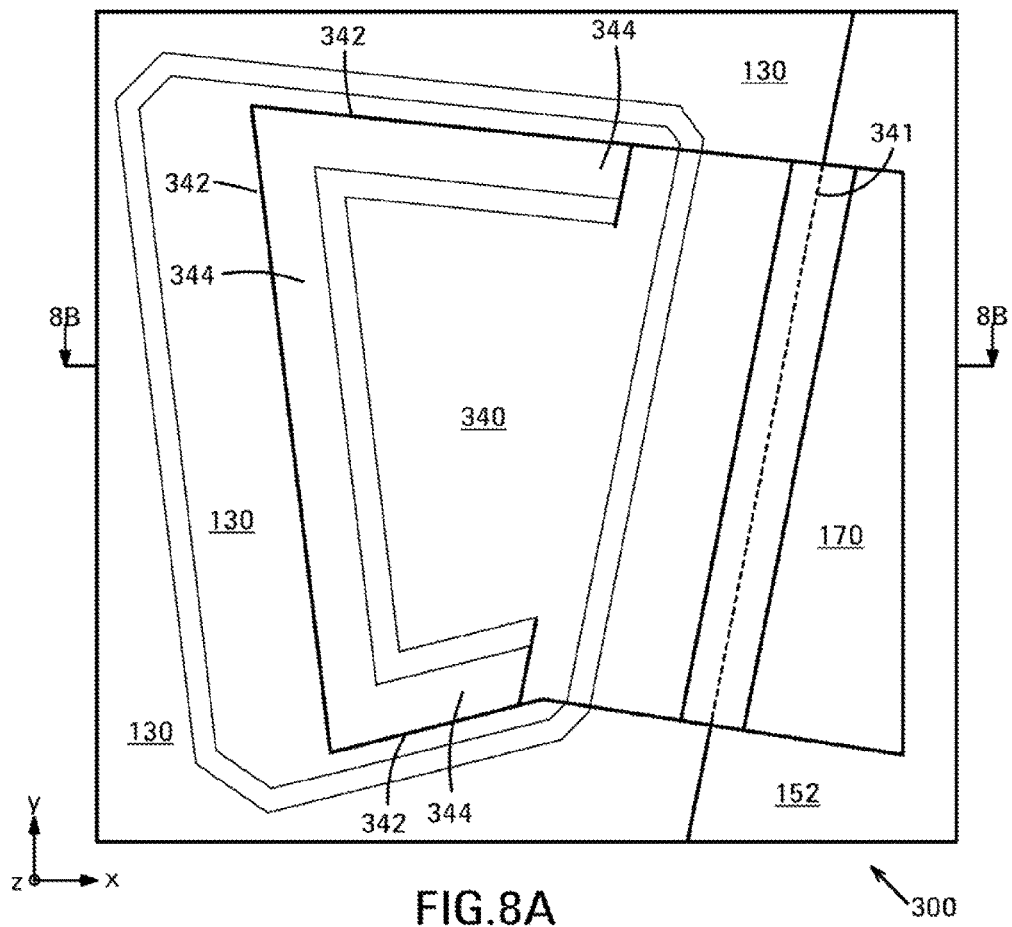
FIGS. 8A and 8B are a plan view and a cross-sectional view, respectively, showing another example of a BAW resonator in accordance with the disclosure.
Figure 8B:
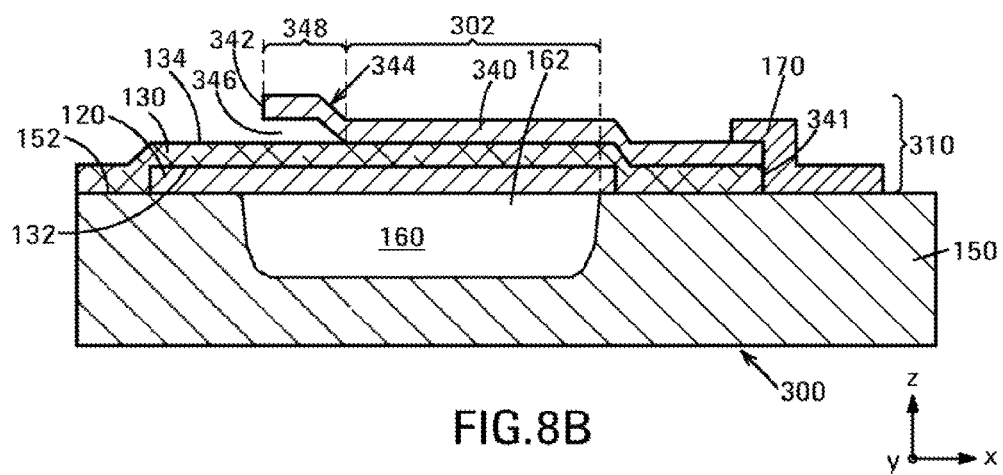

FIG. 8A is a plan view is a plan view of another example 300 of a bulk acoustic wave (BAW) resonator in accordance with this disclosure. FIG. 8B is a cross-sectional view of BAW resonator 300 along the section line 8B-8B shown in FIG. 8A. In the example shown, BAW resonator 300 is embodied as an FBAR. In another example (not shown), BAW resonator 300 is embodied as an SMR that includes an acoustic reflector similar to acoustic reflector 260 described above with reference to FIG. 2. Elements of BAW resonator 300 that correspond to elements of BAW resonator 100 described above with reference to FIGS. 1A and 1B are indicated using the same reference numerals and will not be described again in detail.

BAW resonator 300 includes a substrate 150, a first electrode 120, a second electrode 340, and a piezoelectric layer 130 between first electrode 120 and second electrode 340. First electrode 120, piezoelectric layer 130 and second electrode 340 collectively constitute a resonator stack 310. In the example shown, the entire area of first electrode 120 contacts a first major surface 132 of piezoelectric layer 130. Second electrode 340 contacts a second major surface 134, opposite first major surface 132, of piezoelectric layer 130 over most of its area. However, second electrode 340 includes a cantilevered portion 344 along at least one side of the second electrode. The cantilevered portion 344 of second electrode 340 is separated in the z-direction from the second major surface 134 of piezoelectric layer 130. Thus, second electrode 340 includes a first region and a second region contiguous with the first region. The first region of the second electrode is cantilevered portion 344 that is separated from piezoelectric layer 130 by gap 346. The second region of second electrode 340 is the region of the second electrode that contacts piezoelectric layer 130.

First electrode 120 and second electrode 340 each include a respective electrode material. In an example, the first electrode material of first electrode 120 is molybdenum Mo or tungsten W, and the second electrode material of second electrode 340 is a niobium alloy selected to reduce the temperature coefficient of frequency (TCF) of BAW resonator 300. In another example, niobium alloys are used as both the first electrode material and the second electrode material. In an example, the same niobium alloy is used for both electrode materials. In another example, the niobium alloy used as the first electrode material differs from the niobium alloy used as the second electrode material. Suitable niobium alloys, e.g., alloys of niobium and molybdenum, alloys of niobium and hafnium, and alloys of niobium and zirconium are described above with reference to FIGS. 1A, 1B and 2, and this description will not be repeated here.

Piezoelectric layer 130 is a layer of piezoelectric material doped with one or more rare earth elements, as described above with reference to FIGS. 1A, 1B and 2.

An alternating electrical signal applied between first electrode 120 and second electrode 340 applies an oscillating electric field to piezoelectric layer 130 in the z-direction (i.e., the direction of the thickness of piezoelectric layer 130). In the example shown, the z-axis is the axis for the TE (longitudinal) mode(s) of resonator stack 310. Resonator stack 310 is acoustically isolated from substrate 150 by acoustic reflector 160. In the example shown, acoustic reflector 160 is embodied as a cavity 162 over which resonator stack 310 is suspended. In another example, acoustic reflector 160 is embodied as an acoustic mirror, such as a mismatched acoustic Bragg reflector similar to acoustic reflector 260 described above with reference to FIG. 2, formed in or on substrate 150.

As noted above, the cantilevered portion 344 of second electrode 340 is separated from piezoelectric layer 130 by gap 346. Gap 346 is filled with a low acoustic impedance material, i.e., a solid, liquid, or gas substantially lower in acoustic impedance than the piezoelectric material of piezoelectric layer 130, and the respective electrode materials of first electrode 120 and second electrode 340. In an example, gap 346 is defined as follows. Prior to depositing the electrode material of second electrode 340, a layer (not shown) of sacrificial material is deposited on piezoelectric layer 130. In an example, the sacrificial material is phosphosilicate glass (PSG). A patterning operation is performed to remove the layer of sacrificial material except at the intended location of gap 346 between piezoelectric layer 130 and second electrode 340. Electrode material is then deposited on piezoelectric layer 130 and the sacrificial material. The electrode material is patterned to define second electrode 340. The sacrificial material is then etched away to leave the cantilevered portion 344 of second electrode 340 separated from piezoelectric layer 130 by the gap 346 that formerly was occupied by the sacrificial material. In an example, the sacrificial material that defines gap 346 and the sacrificial material filling cavity 162 are removed in the same etch operation.

In another example, gap 346 is filled with a low acoustic impedance solid material, such as carbon-doped $SiO_2$, or a dielectric resin commercially known as SiLK, or benzocyclobutene (BCB). Gap 346 may be filled with such a low acoustic impedance solid material using a known method. In another example, gap 346 is defined using a process similar to that described above in which the low acoustic impedance solid material is used instead of the sacrificial material, and is not subsequently removed.

BAW resonator 300 includes an active region 302, which is a region of the BAW resonator parallel to the major surface 152 of substrate 150 where acoustic reflector 160, first electrode 120, piezoelectric layer 130, and a region of second electrode 340 in contact with piezoelectric layer 130 all overlap. BAW resonator 300 additionally has an inactive region composed of respective parts of one or more of first electrode 120, piezoelectric layer 130, second electrode 340 and acoustic reflector 160 where not all of these elements overlap. The cantilevered portion 344 of second electrode 340 does not contact piezoelectric layer 130 and is therefore part of the inactive region. It is beneficial to the performance of BAW resonator 300 to reduce the area of the inactive region of the BAW resonator 300 to the extent practical. To this end, there are two different inactive regions in the BAW resonator 300. One inactive region is the so-called "dead BAW resonator" region, which comprises the portions of the first electrode 120, the piezoelectric layer 130 and the second electrode 340 that are overlap and are disposed on the substrate 150. Another inactive region, which is an acoustically decoupled area, such as the cantilevered portion.

The cantilevered portion 344 of second electrode 340 extends beyond the boundary in the x-y plane of the active region 302 by a width 348 as shown. BAW resonator 300 additionally includes interconnect 170 electrically connected to one of the sides of second electrode 340. The side of second electrode 340 to which interconnect 170 connects is referred as here in as a connected side 341. The remaining sides of second electrode 340 are referred to herein as non-connected sides 342. Connected side 341 lacks a cantilevered portion. However, each of one or more of the non-connected sides 342 of second electrode 340 includes a respective cantilevered portion 344 that extends in the x-y plane beyond the boundary of active region 302. In the example shown, each of the non-connected sides 342 of second electrode 340 includes a respective cantilevered portion 344. In another example (not shown), at least one, but not all, of the non-connected sides 342 of second electrode 340 includes a respective cantilevered portion 344.

In the example shown, second electrode 340 has five sides 341, 342 of unequal length. The unequal lengths of the sides of second electrode 340 provide apodization. Other examples of second electrode 340 have more or fewer sides than the number of sides exemplified in FIG. 8A.

In an example, the shape of first electrode 120 is substantially identical to the shape of second electrode 340. However, in some examples, first electrode 120 is larger in area than second electrode 340, although in most cases, first electrode 120 is larger in area than second electrode 340, except at connection edge, where second electrode 340 is crossing over first electrode 120 to effect connections to the BAW resonator 300. Additionally or alternatively, the shape of first electrode 120 may be different from that of second electrode 340.

The fundamental mode of the resonator stack 310 of BAW resonator 300 is a longitudinal extension mode in the z-direction. This mode is excited by the application of an alternating electrical signal between first electrode 120 and second electrode 340. The piezoelectric material of piezoelectric layer 130 converts the applied electrical energy into mechanical energy. In an ideal BAW resonator having infinitesimally thin electrodes, resonance occurs when the frequency of the alternating electrical signal is equal to a mechanical resonant frequency of piezoelectric layer 130. The mechanical resonant frequency is equal to the velocity of sound in the piezoelectric material of piezoelectric layer 130 divided by twice the thickness of the piezoelectric layer, i.e. $f_r = v/(2*T)$, where $f_r$ is the mechanical resonant frequency, T is the thickness of piezoelectric layer 130 and v is the acoustic phase velocity in the piezoelectric material. For practical BAW resonators, in which first electrode 120 and second electrode 340 have non-infinitesimal thicknesses, the above equation is modified in accordance with the weighted acoustic velocities and thicknesses of first and second electrodes 120, 340 and piezoelectric layer 130 constituting resonator stack 310.

A quantitative and qualitative understanding of the Q of a BAW resonator may be obtained by plotting voltage ratio of incident and reflecting signal applying to a FBAR on a Smith chart as the frequency of an alternating electrical signal applied between first electrode 120 and second electrode 340 is varied. The BAW resonator for which the ratio is plotted has a characteristic impedance equal to the system impedance at the frequency of its series resonance. As the frequency of the alternating electrical signal is increased, the magnitude/phase of the BAW resonator sweeps clockwise along a circle on the Smith chart. This is referred to as the Q-circle. Where the Q-circle first crosses the real axes (horizontal axes) of the Smith chart, this corresponds to the frequency $f_s$ of the series resonance of the BAW resonator. The real impedance (measured in ohms) at this point is $R_s$. As the Q-circle continues around the perimeter of the Smith chart, it again crosses the real axes. The second point at which the Q circle crosses the real axis corresponds to the frequency $f_p$ of the parallel resonance of the BAW resonator. The real impedance at the parallel resonant frequency $f_p$ is $R_p$. Often it is desirable to minimize the real impedance $R_s$ of the series resonance while maximizing the real impedance $R_p$ of the parallel resonance.

Qualitatively, the closer the Q-circle is to the outer rim of the Smith chart, the higher the Q-factor of the BAW resonator. The Q-circle of an ideal, lossless BAW resonator has a radius of unity and follows the edge of the Smith chart. However, as noted above, energy losses impair the Q-factor of the BAW resonator and prevent the achievement of this ideal. Examples of such energy losses include Rayleigh-Lamb (lateral or spurious) modes in the x-y plane of piezoelectric layer 130, parallel to the major surface 152 of substrate 150. These lateral modes are due to interfacial mode conversion of the longitudinal mode traveling in the z-direction; and are due to the creation of non-zero propagation vectors, $k_x$ and $k_y$, for both the TE mode and the various lateral modes (e.g., the S0 (symmetric) mode and the zeroth and (asymmetric) modes, A0 and A1), which are due to the difference in effective acoustic phase velocities between the regions of resonator stack 310 where first and second electrodes 120, 340 are located and the surrounding regions of the resonator stack devoid of electrodes. The wavelength of an acoustic signal generated in resonator stack 310 in response to an applied electrical signal of frequency f is v/f, where v is the acoustic phase velocity in the resonator stack.

Regardless of their source, the lateral modes are parasitic in many resonator applications. For example, the parasitic lateral modes couple at the perimeter of the BAW resonator and remove energy available for the longitudinal modes, reducing the Q-factor of the BAW resonator. The reductions in the Q-factor caused by parasitic lateral modes and other acoustic losses can be observed on the Q-circle of a Smith chart of the $S_{11}$ parameter.

Figure 9A:
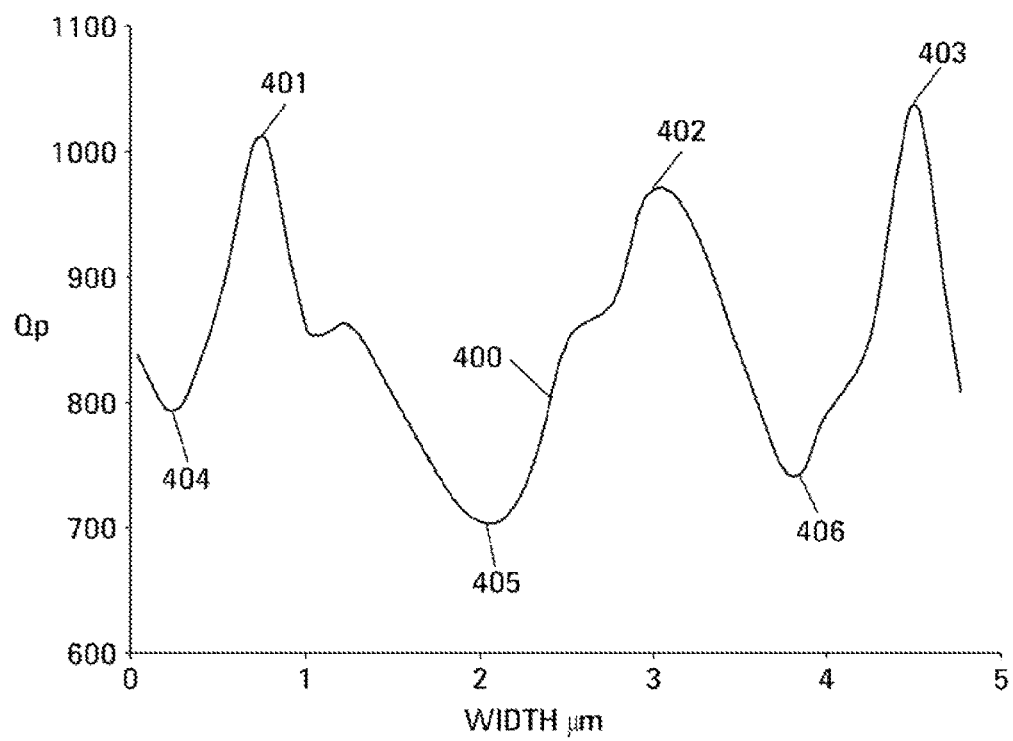
FIGS. 9A and 9B are graphs respectively showing the Q-factor $Q_p$ of the parallel resonance and the Q-factor $Q_s$ of the series resonance of an example of the BAW resonator shown in FIGS. 8A and 8B plotted against width of the cantilever portion of the second electrode.
Figure 9B:
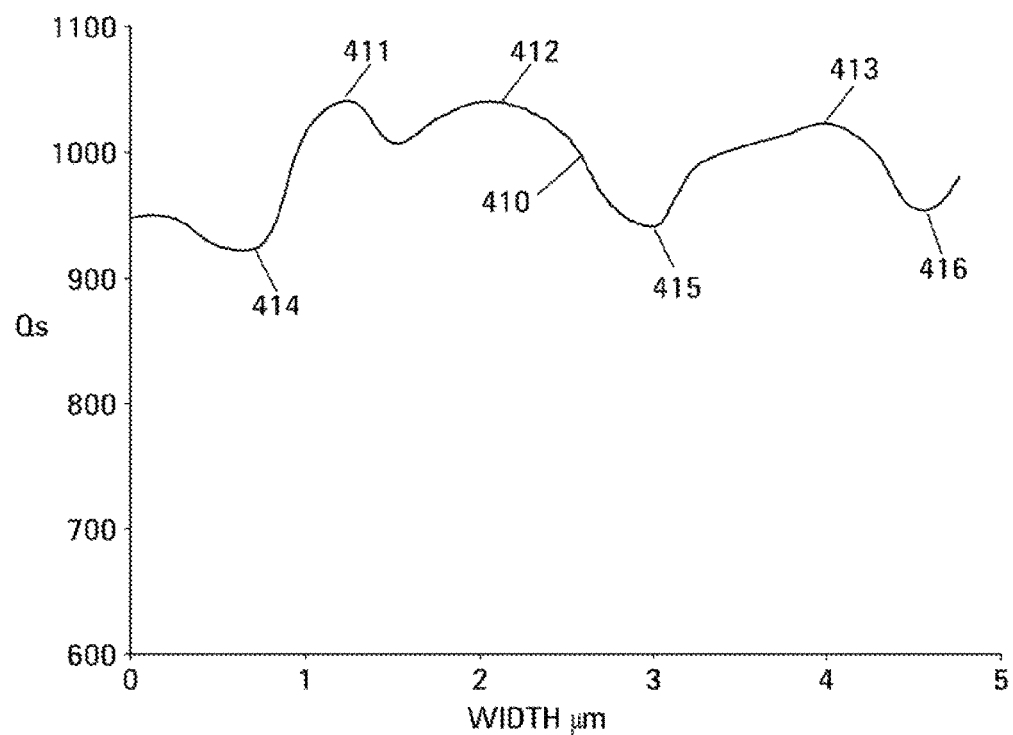

FIGS. 9A and 9B are graphs respectively showing the Q-factor $Q_p$ of the parallel resonance and the Q-factor $Q_s$ of the series resonance of an example of BAW resonator 300. In the graphs, curves 400 and 410 respectively represent the Q-factor $Q_p$ of the parallel resonance and the Q-factor $Q_s$ of the series resonance plotted against the width 348 of the cantilevered portions 344 of second electrode 340. In the example of BAW resonator 300 from which the data shown in FIGS. 9A and 9B were obtained, second electrode 340 included respective cantilevered portions 344 along its three non-connected sides 342, similar to the example shown in FIGS. 8A and 8B.

Referring first to FIG. 9A, the Q-factor $Q_p$ of the parallel resonance depends on the width 348 of cantilevered portions 344. In the example shown, the variation of the Q-factor $Q_p$ of the parallel resonance with the width of cantilevered portions 344 is periodic, and exhibits maxima indicated at 401, 402 and 403, and minima indicated at 404, 405 and 406 as width 348 increases. With certain widths of cantilevered portions 344, the Q-factor $Q_p$ of the parallel resonance is significantly greater than the Q-factor $Q_p$ obtained with cantilevered portion 344 having a width 348 of zero, which is equivalent to an embodiment of BAW resonator 300 in which second electrode 340 has no cantilevered portions 344.

It is believed that periodicity of the Q-factor $Q_p$ of the parallel resonance (i.e., differences in the width 348 of cantilevered portion 344 between successive maxima or successive minima of the Q-factor) is related to the acoustic wavelength. At the maxima of Q-factor $Q_p$, the frequency of the mechanical vibration of the cantilevered portion 344 differs from the mechanical resonant frequency of the cantilevered portion; whereas at the minima, the frequency of the mechanical vibration of cantilevered portion 344 coincides with a mechanical resonant frequency of the cantilevered portion. In the graph shown in FIG. 9A, for example, as frequency decreases, acoustic wave length increases, and the width of the cantilevered portion 344 at a maxima increases accordingly. It is believed that as cantilever width increases, its correspondent resonant frequency decreases, and therefore the cantilevered portion 344 may interact with lateral modes which have similar frequencies. At the same time, the cantilevered portion 344 may have harmonics that may also interact with the lateral modes, either suppressing or reflecting these modes.

The cantilevered portion(s) 344 of second electrode 340 change the acoustic impedance at the boundary in the x-y plane of the active region 302 of BAW resonator 300. The change in acoustic impedance promotes reflection of lateral modes at the boundary. In the example shown, the boundary between the active region 302 of BAW resonator 300 and cantilevered portion 344 is a boundary between solid (electrodes and piezoelectric layer) and the contents of gap 346 (air in the example shown). This presents a comparatively large acoustic impedance mismatch and a comparatively high reflection coefficient that are highly effective at reflecting lateral modes. This improves the Q-factor by two mechanisms. First, because the lateral modes are reflected back into resonator stack 310 at the boundary, their energy is not lost. Reducing the loss of energy increases the Q-factor. Second, a portion of the energy of the reflected lateral modes is converted into energy in the desired longitudinal modes. Converting lateral mode energy into longitudinal mode energy increases the Q-factor. As a result, the cantilevered portions 344 of second electrode 340 increase the Q-factor $Q_p$ of the parallel resonance of BAW resonator 300.

Referring now to FIG. 9B, the Q-factor $Q_s$ of the series resonance is dependent on the width 348 of the cantilevered portion 344 of second electrode 340 and the frequency of the series resonance. In the example shown, the variation of the Q-factor $Q_s$ of the series resonance with the width of cantilevered portions 344 is periodic, and exhibits maxima indicated at 411, 412 and 413, and minima indicated at 414, 415 and 416 as width 348 increases. With certain widths of cantilevered portions 344, the Q-factor $Q_s$ of the series resonance is significantly greater than the Q-factor $Q_s$ obtained with cantilevered portion 344 having a width 348 of zero, which is equivalent to an embodiment of BAW resonator 300 in which second electrode 340 has no cantilevered portions 344.

As described above, the cantilevered portion 344 of second electrode 340 at the boundary in the x-y plane of the active region 302 of BAW resonator 300 promotes the reflection of lateral acoustic modes at the boundary due to the impedance mismatch at the boundary. This results in an improved Q-factor. It is believed that the minima in FIG. 9B may result from the excitation of a mechanical resonance of the cantilevered portion 344, which results in losses. The mechanical resonances at minima 414, 415 and 416 absorb energy, so that less energy is reflected back into the active region 302 of BAW resonator 300. This results in a reduced Q-factor. Accordingly, when designing BAW resonator 300, the width 348 of cantilevered portion 344 is beneficially set to a width at which both the Q-factor $Q_p$ of the parallel resonance and the Q-factor Q of the series resonance are at or close to one of their maxima 401, 402, or 403, and 411, 412, or 413.

Unlike some other approaches to increasing the reflection of lateral modes at the lateral boundary of the active region of a BAW resonator, cantilevered portion 344 does not generate spurious modes because its location is outside active region 302. Additionally, cantilevered portion 344 does not significantly degrade the electromechanical coupling coefficient $k_t^2$ of BAW resonator 300.

Figure 10A:
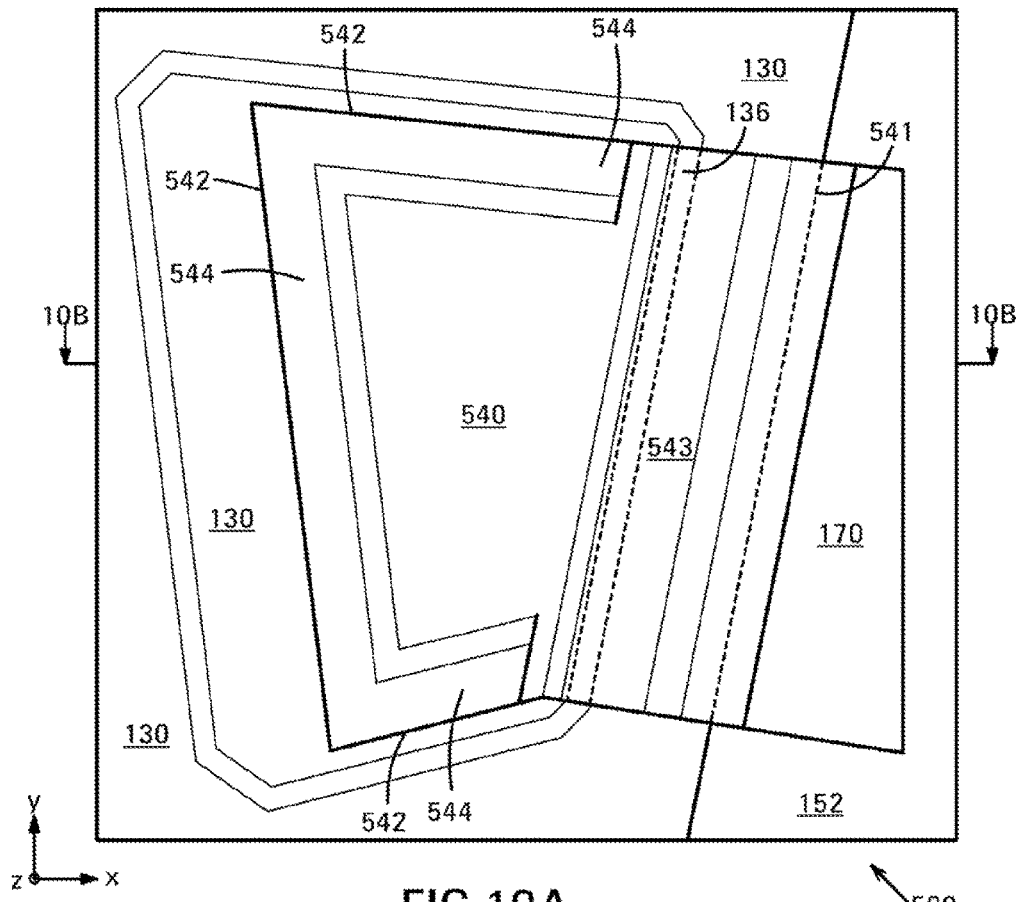
FIGS. 10A and 10B are a plan view and a cross-sectional view, respectively, showing another example of a BAW resonator in accordance with the disclosure.
Figure 10B:
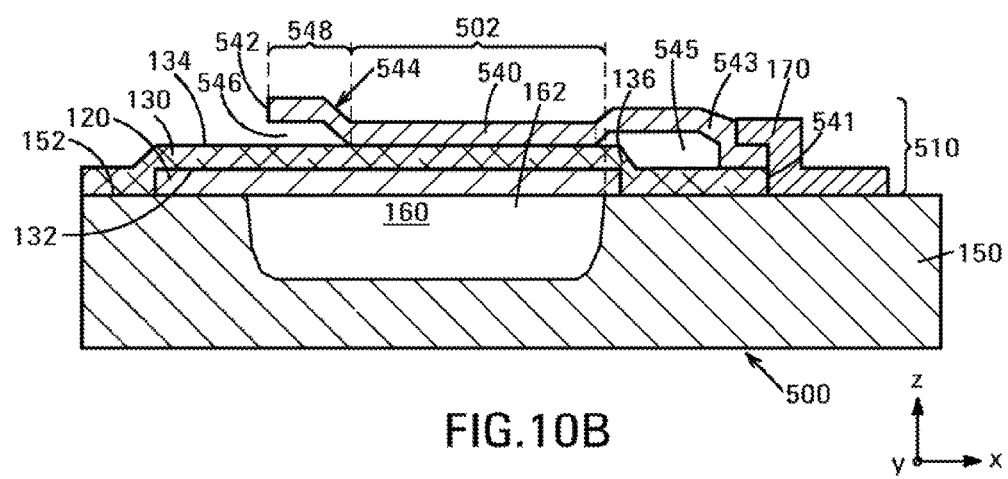

FIG. 10A is a plan view is a plan view of another example 500 of bulk acoustic wave (BAW) resonator in accordance with this disclosure. FIG. 10B is a cross-sectional view of BAW resonator 500 along the section line 10B-10B shown in FIG. 10A. Elements of BAW resonator 500 that correspond to elements of BAW resonator 300 described above with reference to FIGS. 8A and 8B are indicated using the same reference numerals and will not be described again here.

BAW resonator 500 includes a substrate 150, a first electrode 120, a second electrode 540, and a piezoelectric layer 130 between first electrode 120 and second electrode 540. First electrode 120, piezoelectric layer 130 and second electrode 540 collectively constitute a resonator stack 510. In the example shown, the entire area of first electrode 120 contacts first major surface 132 of piezoelectric layer 130. Second electrode 540 contacts second major surface 134, opposite first major surface 132, of piezoelectric layer 130 over most of its area. However, second electrode 540 includes a cantilevered portion 544 along at least one side of the second electrode and a bridge 543 along another side of the second electrode. The cantilevered portion 544 of second electrode 540 is separated in the z-direction from the second major surface 134 of piezoelectric layer 130 by a gap 546. Cantilevered portion 544 is similar to cantilevered portion 344 described above with reference to FIGS. 8A and 8B, and will not be described again here.

First electrode 120 and second electrode 540 each include a respective electrode material. In an example, the first electrode material of first electrode 120 is molybdenum Mo or tungsten W, and the second electrode material of second electrode 540 is a niobium alloy selected to reduce the temperature coefficient of frequency (TCF) of BAW resonator 500. In another example, niobium alloys are used as both the first electrode material and the second electrode material. In an example, the same niobium alloy is used for both electrode materials. In another example, the niobium alloy used as the first electrode material differs from the niobium alloy used as the second electrode material. Suitable niobium alloys, e.g., alloys of niobium and molybdenum, alloys of niobium and hafnium, and alloys of niobium and zirconium are described above with reference to FIGS. 1A, 1B and 2, and this description will not be repeated here.

Piezoelectric layer 130 is a layer of piezoelectric material doped with one or more rare earth elements, as described above with reference to FIGS. 1A, 1B and 2.

The bridge 543 of second electrode 540 is separated in the z-direction from the second major surface 134 of piezoelectric layer 130 by a gap 545. Gap 545 is filled with a low acoustic impedance material, i.e., a solid, liquid, or gas substantially lower in acoustic impedance than the piezoelectric material of piezoelectric layer 130, and the respective electrode materials of first electrode 120 and second electrode 540. Examples of low acoustic impedance materials are described above with reference to FIGS. 8A and 8B. The fabrication methods described above with reference to FIGS. 8A and 8B for fabricating cantilevered portion 344 may be used to fabricate bridge 543. Bridge 543 and cantilevered portion 544 may be fabricated together using a common set of process operations. Bridge 543 is further described in greater detail in U.S. Pat. No. 8,248,185, assigned to the assignee of this disclosure.

BAW resonator 500 includes an active region 502, which is a region of the BAW resonator parallel to the major surface 152 of substrate 150 where acoustic reflector 160, first electrode 120, piezoelectric layer 130, and a region of second electrode 540 in contact with piezoelectric layer 130 all overlap. BAW resonator 500 additionally has an inactive region composed of respective parts of one or more first electrode 120, piezoelectric layer 130, second electrode 540 and acoustic reflector 160 where not all of these elements overlap. The cantilevered portion 544 and bridge 543 of second electrode 540 do not contact piezoelectric layer 130 and are therefore part of the inactive region.

Thus, referring to FIG. 10A, second electrode 540 includes a first region, a second region contiguous with the first region, a third region contiguous with the second region and opposite the first region, and a fourth region contiguous with the third region and opposite the second region. The first region of second electrode 540 is cantilevered portion 544 that is separated from piezoelectric layer 130 by gap 546. The second region of second electrode 540 is the region of the second electrode that contacts the second major surface 134 of piezoelectric layer 130. The third region of second electrode 540 extends across a lateral boundary of active region 502 and is separated from piezoelectric layer 130 by gap 545. The fourth region of second electrode 540 is outside active region 502 and is in contact with piezoelectric layer 130.

In a manner similar to that described above with reference to FIGS. 8A and 8B, the cantilevered portion 544 of second electrode 540 provides an improvement in the Q-factors of the series and parallel resonances of BAW resonator 500. Deposition of piezoelectric layer 130 on first electrode 120 forms a transition 136 where the piezoelectric layer crosses the side of the first electrode. At transition 136, piezoelectric layer 130 often includes material defects and voids, in particular, structural defects such as lattice defects and voids. These defects and voids can result in losses of acoustic energy of the mechanical waves propagating in the piezoelectric material. A loss of acoustic energy loss results in a reduction in the Q-factor of the BAW resonator. However, bridge 543 separates second electrode 540 from piezoelectric layer 130 in a region spanning transition 136, and excludes the transition 136 of piezoelectric layer 130 and the defects and voids therein from the active region 502 of BAW resonator 500. As a result, bridge 532 reduces the acoustic losses due to the defects and voids in piezoelectric layer 130 at transition 136, and increases the Q-factors of the series and parallel resonances of the BAW resonator.

Moreover, cantilevered portion 544 and bridge 543 together provide an improvement in the Q-factors of the series and parallel resonances of BAW resonator 500 greater than the improvement provided by each of them alone. Specifically bridge 543 and cantilevered portion 544 together provide a significant improvement in the Q-factor $Q_p$ of the parallel resonance and provide some improvement in the Q-factor $Q_s$ of the series resonance. This is somewhat expected, since bridge 543 predominantly impacts the Q-factor $Q_p$ of the parallel resonance, as described in U.S. Pat. No. 8,248,185 referred to above.

Figure 11A:
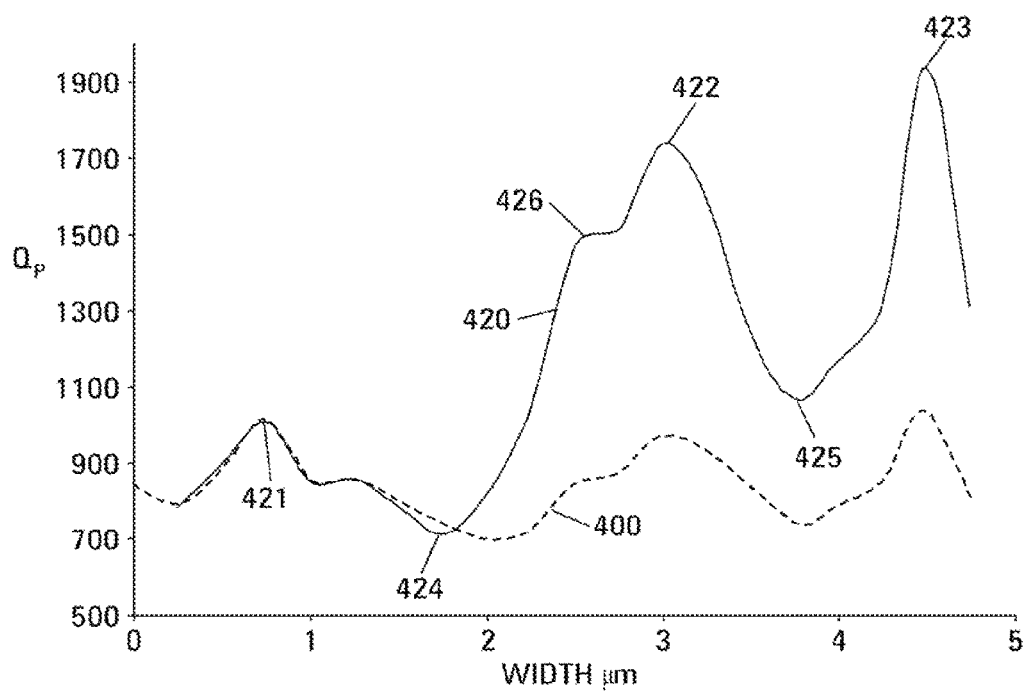
FIGS. 11A and 11B are graphs respectively showing the Q-factor $Q_p$ of the parallel resonance and the Q-factor $Q_s$ of the series resonance of an example of the BAW resonator shown in FIGS. 10A and 10B plotted against width of the cantilever portion of the second electrode.
Figure 11B:
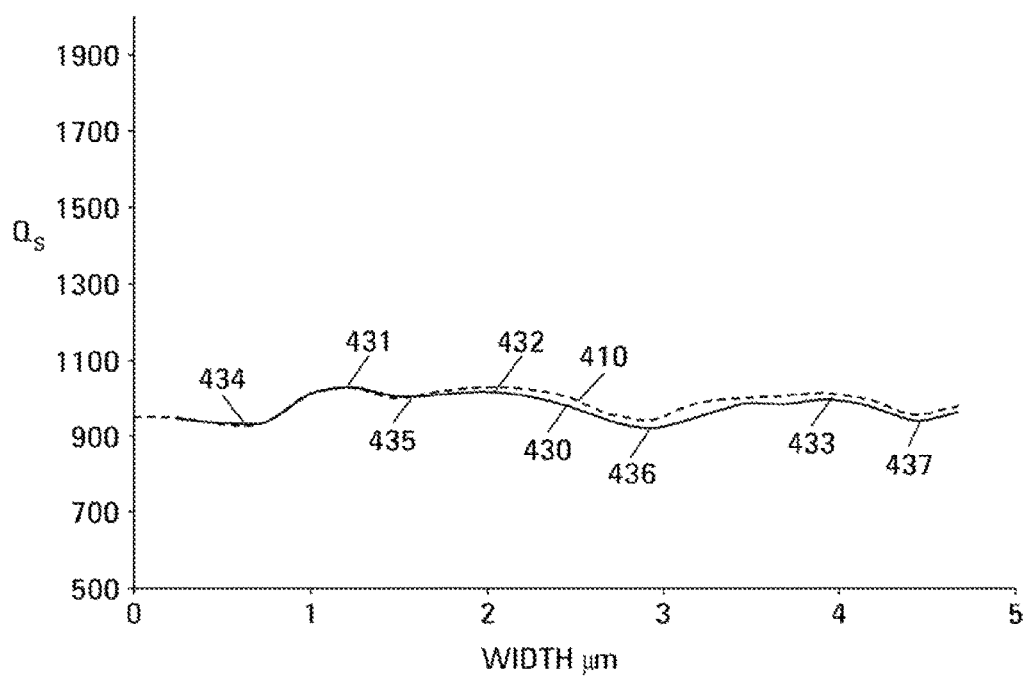

FIGS. 11A and 11B are graphs respectively showing the Q-factor $Q_p$ of the parallel resonance and the Q-factor $Q_s$ of the series resonance of an example of BAW resonator 500. In the graphs, curves 420 and 430 respectively represent the Q-factor $Q_p$ of the parallel resonance and the Q-factor Qs of the series resonance of an example of BAW resonator 500 plotted against the width of the cantilevered portions 544 of second electrode 540. In the example of BAW resonator 500 from which the data shown in FIGS. 11A and 11B were obtained, second electrode 540 included respective cantilevered portions 544 along its three non-connected sides 542, and bridge 543 along its connected side 541, similar to the example shown in FIGS. 10A and 10B.

Referring first to FIG. 11A, the Q-factor $Q_p$ of the parallel resonance depends on the width 548 of cantilevered portions 544. In the example shown, the variation of the Q-factor $Q_p$ of the parallel resonance with the width of cantilevered portions 544 is periodic, and exhibits maxima indicated at 421, 422 and 423, and local minima indicated at 424 and 425 as width 548 increases. With certain widths of cantilevered portions 544, the Q-factor $Q_p$ of the parallel resonance is significantly greater than the Q-factor $Q_p$ obtained with cantilevered portion 544 having a width 548 of zero, which is equivalent to an embodiment of BAW resonator 500 in which second electrode 540 has no cantilevered portions 544.

The synergistic impact of the combination of bridge 543 and cantilevered portions 544 on the Q-factor $Q_p$ of the parallel resonance of BAW resonator 500 can be appreciated by comparing curve 420 with curve 400 in FIG. 11A. Curve 400 is the plot of the Q-factor $Q_p$ of the parallel resonance of BAW resonator 300 taken from FIG. 9A and re-plotted on the same y-axis scale as curve 420. In examples in which the width of cantilevered portions 344, 544 is approximately 2.5 μm, the Q-factor $Q_p$ of the parallel resonance of BAW resonator 300, which includes only cantilevered portion 344, is approximately 850, whereas that of BAW resonator 500, which includes bridge 543 in addition to cantilevered portion 544, is approximately 1500 (indicated at 426). Similarly, in examples in which the width of cantilevered portions 344, 544 is approximately 3.0 μm, the Q-factor $Q_p$ of the parallel resonance of BAW resonator 300, which includes only cantilevered portion 344, is approximately 975, whereas that of BAW resonator 500, which includes bridge 543 in addition to cantilevered portion 544, is approximately 1750 (indicated at 422).

Referring now to FIG. 11B, the Q-factor $Q_s$ of the series resonance depends on the width 548 of cantilevered portions 544 and the frequency of the series resonance. In the example shown, the variation of the Q-factor $Q_s$ of the series resonance with the width of cantilevered portions 544 exhibits a mild periodicity, with maxima indicated at 431, 432 and 433, and minima indicated at 434, 435, 436 and 437 as width 548 increases. With certain widths of cantilevered portions 544, e.g., at the width corresponding to maximum 431, the Q-factor Q, of the series resonance is larger than the Q-factor $Q_s$ obtained with cantilevered portion 544 having a width 548 of zero, which is equivalent to an embodiment of BAW resonator 500 in which second electrode 540 has no cantilevered portions 544.

FIG. 11B includes curve 410 in addition to curve 430 to demonstrate the relatively small improvement, described above, in the Q-factor $Q_s$ of the series resonance of BAW resonator 500 provided by the bridge 301. Curve 410 is the plot of the Q-factor $Q_s$ of the series resonance of the example of BAW resonator 300 taken from FIG. 9B and re-plotted in FIG. 11B on the same y-axis scale as curve 430.

The BAW resonators disclosed herein may be fabricated according to known semiconductor processing methods and using known materials. For example, the BAW resonators may be fabricated using the fabrication methods disclosed by Ruby et al, in U.S. Pat. Nos. 5,587,620; 5,873,153; 6,384,697; 6,507,983; and 7,275,292 and by Bradley, et al. in U.S. Pat. No. 6,828,713, all assigned to the assignee of this disclosure. Other fabrication methods are known and may be used.

When connected in a selected topology, such as that described by Ellå, et al. in U.S. Pat. No. 5,910,756, or that described by Bradley, et al. in U.S. Pat. No. 6,262,637, multiple instances of BAW resonators 100, 300, or 500 can be interconnected to function as an electrical filter. Moreover, the BAW resonators disclosed herein are contemplated in a variety of applications besides duplexers.

This disclosure describes the invention in detail using illustrative embodiments. However, the invention defined by the appended claims is not limited to the precise embodiments described.

We claim:

1. A bulk acoustic wave (BAW) resonator, comprising:
 a first electrode of a first electrode material, the first electrode having a first electrode thickness;
 a second electrode of a second electrode material, the second electrode having a second electrode thickness; and
 a piezoelectric layer between the first electrode and the second electrode, the piezoelectric layer comprising a piezoelectric material doped with at least one rare earth element, and having a piezoelectric layer thickness; in which:
 the BAW resonator has a resonant frequency dependent at least in part on the first electrode thickness, the first electrode material, the second electrode thickness, the second electrode material, the piezoelectric layer thickness, and the piezoelectric material, the resonant frequency having a temperature coefficient; and
 at least one of the first electrode material and the second electrode material is a niobium alloy that, relative to molybdenum as the respective at least one of the first electrode material and the second electrode material, reduces the temperature coefficient of the resonant frequency of the BAW resonator.

2. The BAW resonator of claim 1, in which the niobium alloy comprises niobium and molybdenum.

3. The BAW resonator of claim 2, in which the niobium alloy has a positive temperature coefficient of frequency.

4. The BAW resonator of claim 1, in which the niobium alloy comprises niobium and hafnium.

5. The BAW resonator of claim 4, in which the niobium alloy has a hafnium percentage ranging from 5% to 20%.

6. The BAW resonator of claim 1, in which the niobium alloy comprises niobium and zirconium.

7. The BAW resonator of claim 6, in which the niobium alloy has a zirconium percentage ranging from 5% to 10%.

8. The BAW resonator of claim 1, in which the piezoelectric material comprises aluminum nitride and the at least one rare earth element is scandium.

9. The BAW resonator of claim 8, in which an atomic percentage of scandium in the piezoelectric material ranges from 0.5% to 10.0%.

10. The BAW resonator of claim 8, in which an atomic percentage of scandium in the piezoelectric material ranges from 0.5% to 44.0%.

11. The BAW resonator of claim 8, in which an atomic percentage of scandium in the piezoelectric material ranges from 2.5% to 5.0%.

12. The BAW resonator of claim 1, in which the piezoelectric material comprises aluminum nitride and the rare earth elements are scandium and erbium.

13. The BAW resonator of claim 1, in which both the first electrode material and the second electrode material are niobium alloys.

14. The BAW resonators of claim 1, in which, for a specified electromechanical coupling coefficient $k_t^2$ and series resonance frequency $F_s$ of the BAW resonator, the first electrode and the second electrode are each greater in thickness than a first electrode and a second electrode, respectively, of a BAW resonator comprising an undoped piezoelectric layer.

15. The BAW resonator of claim 14, in which, for the specified electromechanical coupling coefficient and series resonance frequency, the piezoelectric layer comprising the piezoelectric material doped with at least one rare earth element is thinner than the undoped piezoelectric layer.

16. The BAW resonator of claim 1, additionally comprising:
an acoustic reflector adjacent the first electrode, and
an active region where the acoustic reflector, the first electrode, the piezoelectric layer and the second electrode all overlap.

17. The BAW resonator of claim 16, in which, in a plane parallel to a major surface of the piezoelectric layer, the second electrode comprises a first region and a second region contiguous with the first region, the first region spaced from the piezoelectric layer by a gap, the second region contacting the piezoelectric layer.

18. The BAW resonator claim 17, in which the first region of the second electrode extends outside the active region of the BAW resonator.

19. A bulk acoustic wave (BAW) resonator, comprising:
a first electrode of a first electrode material, the first electrode having a first electrode thickness;
a second electrode of a second electrode material, the second electrode having a second electrode thickness; and
a piezoelectric layer between the first electrode and the second electrode, the piezoelectric layer comprising a piezoelectric material doped with at least one rare earth element, and having a piezoelectric layer thickness; in which:
the BAW resonator has a resonant frequency dependent at least in part on the first electrode thickness, the first electrode material, the second electrode thickness, the second electrode material, the piezoelectric layer thickness, and the piezoelectric material, the resonant frequency having a temperature coefficient; and
at least one of the first electrode material and the second electrode material comprises a niobium and molybdenum alloy that, relative to molybdenum as the respective at least one of the first electrode material and the second electrode material, reduces the temperature coefficient of the resonant frequency of the BAW resonator, wherein the niobium and molybdebum alloy has a niobium percentage in the range of 50% to 90%, or a niobium percentage in the range of 65% to 75%, or a niobium percentage in the range of 68% to 72%.

20. The BAW resonator of claim 19, in which the piezoelectric material comprises aluminum nitride and the rare earth elements are scandium and erbium.

21. The BAW resonator of claim 19, in which both the first electrode material and the second electrode material are niobium and molybdenum alloys.

22. The BAW resonators of claim 19, in which, for a specified electromechanical coupling coefficient $k_t^2$ and series resonance frequency $F_s$ of the BAW resonator, the first electrode and the second electrode are each greater in thickness than a first electrode and a second electrode, respectively, of a BAW resonator comprising an undoped piezoelectric layer.

23. The BAW resonator of claim 22, in which, for the specified electromechanical coupling coefficient and series resonance frequency, the piezoelectric layer comprising the piezoelectric material doped with at least one rare earth element is thinner than the undoped piezoelectric layer.

24. The BAW resonator of claim 19, additionally comprising:
an acoustic reflector adjacent the first electrode, and
an active region where the acoustic reflector, the first electrode, the piezoelectric layer and the second electrode all overlap.

25. The BAW resonator of claim 24, in which, in a plane parallel to a major surface of the piezoelectric layer, the second electrode comprises a first region and a second region contiguous with the first region, the first region spaced from the piezoelectric layer by a gap, the second region contacting the piezoelectric layer.

26. The BAW resonator claim 25, in which the first region of the second electrode extends outside the active region of the BAW resonator.

27. The BAW resonator of claim 26, in which:
the second electrode additionally comprises a third region contiguous with the second region and opposite the first region, and a fourth region contiguous with the third region and opposite the second region;
the third region extends across a termination of the active region and is separated from the piezoelectric layer by a gap; and
the fourth region is outside the active region and is in contact with the piezoelectric layer.

28. A bulk acoustic wave (BAW) resonator, comprising:
a first electrode of a first electrode material, the first electrode having a first electrode thickness;
a second electrode of a second electrode material, the second electrode having a second electrode thickness;
a piezoelectric layer between the first electrode and the second electrode, the piezoelectric layer comprising a piezoelectric material doped with at least one rare earth element, and having a piezoelectric layer thickness;
an acoustic reflector adjacent the first electrode, and
an active region where the acoustic reflector, the first electrode, the piezoelectric layer and the second electrode all overlap in which:
the BAW resonator has a resonant frequency dependent at least in part on the first electrode thickness, the first electrode material, the second electrode thickness, the second electrode material, the piezoelectric layer thickness, and the piezoelectric material, the resonant frequency having a temperature coefficient;
at least one of the first electrode material and the second electrode material is a niobium alloy that, relative to molybdenum as the respective at least one of the first electrode material and the second electrode material, reduces the temperature coefficient of the resonant frequency of the BAW resonator;
in a plane parallel to a major surface of the piezoelectric layer, the second electrode comprises a first region and a second region contiguous with the first region, the first region spaced from the piezoelectric layer by a gap, the second region contacting the piezoelectric layer;
the second electrode additionally comprises a third region contiguous with the second region and opposite the first region, and a fourth region contiguous with the third region and opposite the second region;
the third region extends across a termination of the active region and is separated from the piezoelectric layer by a gap; and
the fourth region is outside the active region and is in contact with the piezoelectric layer.

* * * * *